US006849380B2

(12) United States Patent
Watanabe

(10) Patent No.: US 6,849,380 B2
(45) Date of Patent: Feb. 1, 2005

(54) POSITIVE HEAT-SENSITIVE LITHOGRAPHIC PRINTING PLATE

(75) Inventor: Noriaki Watanabe, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 23 days.

(21) Appl. No.: 10/364,400

(22) Filed: Feb. 12, 2003

(65) Prior Publication Data

US 2003/0183106 A1 Oct. 2, 2003

(30) Foreign Application Priority Data

Feb. 20, 2002 (JP) .................................... P. 2002-043565

(51) Int. Cl.$^7$ .................................................. G03F 7/11

(52) U.S. Cl. ............................... 430/270.1; 430/271.1; 430/278.1; 101/454

(58) Field of Search ........................... 430/270.1, 271.1, 430/273.1, 278.1, 281.1, 286.1, 302, 964; 101/453, 454, 463.1

(56) References Cited

U.S. PATENT DOCUMENTS

| | | | | | |
|---|---|---|---|---|---|
| 6,114,089 | A | * | 9/2000 | Takita et al. | 430/278.1 |
| 6,277,541 | B1 | * | 8/2001 | Uno et al. | 430/278.1 |
| 6,440,633 | B1 | * | 8/2002 | Kawauchi | 430/270.1 |
| 2002/0039703 | A1 | * | 4/2002 | Hotta et al. | 430/302 |
| 2003/0145748 | A1 | * | 8/2003 | Endo et al. | 101/458 |
| 2003/0165775 | A1 | * | 9/2003 | Endo et al. | 430/278.1 |

FOREIGN PATENT DOCUMENTS

| | | | | | |
|---|---|---|---|---|---|
| EP | 992 850 | A2 | | 4/2000 | |
| EP | 1 273 439 | A2 | * | 1/2004 | B41C/1/10 |
| JP | 10-282645 | | * | 10/1998 | G03F/7/00 |

* cited by examiner

*Primary Examiner*—Barbara L. Gilliam
(74) *Attorney, Agent, or Firm*—Sughrue Mion, PLLC

(57) ABSTRACT

A positive heat-sensitive lithographic printing plate comprising an anodically oxidized aluminum support having laminated thereon an undercoating layer containing a polymer having a constituent having an acid radical and a constituent having an onium group, an interlayer containing a water-insoluble and alkali-soluble resin, and a heat-sensitive layer containing a water-insoluble and alkali-soluble resin and an infrared-absorbing dye in this order from the support, and the solubility of the heat-sensitive layer in an alkali aqueous solution increases by heating.

4 Claims, No Drawings

POSITIVE HEAT-SENSITIVE LITHOGRAPHIC PRINTING PLATE

FIELD OF THE INVENTION

The present invention relates to a positive (working) heat-sensitive lithographic printing plate, particularly to a positive (working) heat-sensitive lithographic printing plate with an enlarged development latitude.

BACKGROUND OF THE INVENTION

The advancement of the laser is remarkable in recent years, in particular, high output and compact size solid state lasers and semiconductor lasers having an emission area in near infrared to infrared regions are easily available. These lasers are very useful as exposure light sources for directly plate-making from digital data such as the computer.

The materials for positive lithographic printing plates for infrared lasers comprise, as essential components, a binder resin which is soluble in an alkali aqueous solution and an IR dye and the like which absorbs light and generates heat. The IR dye and the like functions as a dissolution inhibitor to substantially lower the solubility of the binder resin by the interaction with the binder resin at a non-exposed area (an image area), and the interaction of the IR dye, etc., with the binder resin is weakened by the heat generated at an exposed area (a non-image area), and the binder resin is dissolved in an alkali developing solution, thereby a lithographic printing plate is formed.

However, in these materials for positive lithographic printing plates for infrared lasers, the difference between the solubility resistance of a non-exposed area (an image area) in a developing solution and the solubility of an exposed area (a non-image area) in various use conditions cannot not be said to be sufficient, so that there is a problem that over-development and development failure are liable to occur due to variation in use conditions. Further, when the surface condition slightly varies by, e.g., mere touching of the surface during handling, a non-exposed area (the image area) is dissolved at development resulting in a scratch-like trace, which causes problems of the degradation in press life and ink adhesion failure.

Such problems originate in the fundamental difference in the plate-making mechanism between the positive lithographic printing plate materials for infrared lasers and the positive lithographic printing plate materials which are subjected to UV exposure for plate-making. That is, the positive lithographic printing plate materials which are subjected to UV exposure for plate-making comprise a binder resin soluble in an alkali aqueous solution, an onium salt and quinonediazide compounds as essential components, and these onium salt and quinonediazide compounds have two roles of not only functioning as a dissolution inhibitor by the interaction with the binder resin at a non-exposed area (an image area) but also being decomposed by light at an exposed area (a non-image area), to thereby generate an acid and function as a dissolution accelerator.

On the other hand, an IR dye and the like in the positive lithographic printing plate materials for infrared lasers function only as dissolution inhibitors at a non-exposed area (an image area) and do not accelerate dissolution at an exposed area (a non-image area). Accordingly, those having high solubility in an alkali developing solution cannot help being used beforehand as the binder resins for making discrimination between the solubilities at a non-exposed area and at an exposed area in the positive lithographic printing plate materials for infrared lasers. Therefore, the condition before development becomes labile.

Further, there is a problem in the positive lithographic printing plate materials for infrared lasers that sensitivity is liable to fluctuate due to a trace difference in exposure amount by the influence of a temperature increase and diffusion.

SUMMARY OF THE INVENTION

An object of the present invention is to provide a positive (working) heat-sensitive lithographic printing plate for infrared lasers for direct plate-making which is excellent in latitude in development for image-forming and high speed.

As a result of eager investigation by the present inventor for achieving the above object, the present invention has been accomplished. That is, the present invention is as follows.

(1) A positive heat-sensitive lithographic printing plate comprising an anodically oxidized aluminum support having laminated thereon an undercoating layer containing a polymer having a constituent having an acid radical and a constituent having an onium group, an interlayer containing a water-insoluble and alkali-soluble resin, and a heat-sensitive layer containing a water-insoluble and alkali-soluble resin and an infrared-absorbing dye in this order from the support, and the solubility of the heat-sensitive layer in an alkali aqueous solution increases by heating.

(2) The positive heat-sensitive lithographic printing plate as described in the above item (1), wherein the number average molecular weight of the polymer Mn is from 300 to 100,000, and the coating weight of the undercoating layer is from 1 to 30 $mg/m^2$.

(3) The positive heat-sensitive lithographic printing plate as described in the above item (1), wherein the infrared-absorbing dye is at least one of cyanine dyes.

DETAILED DESCRIPTION OF THE INVENTION

The polymers which are used to form the undercoating layer of the positive (working)heat-sensitive lithographic printing plate in the present invention (hereinafter sometimes referred to as merely the polymers in the present invention) are described in detail below.

The polymers in the present invention are compounds obtained by copolymerizing a constituent having at least an acid radical and a constituent having at least an onium group.

Preferred acid radicals are acid radicals having an acid dissociation constant (pKa) of 7 or less, —COOH, —$SO_3H$, —$OSO_3H$, —$PO_3H_2$, —$OPO_3H_2$, —$CONHSO_2$ and —$SO_2NHSO_2$ are more preferred, and —COOH is most preferred. Preferred onium groups are onium groups comprising atoms belonging to Group V or Group IV of the Periodic Table, onium groups comprising a nitrogen atom, a phosphorus atom or a sulfur atom are more preferred, and an onium group comprising a nitrogen atom is most preferred.

Of the polymers in the present invention, the polymers having a main chain structure of vinyl-based polymers, e.g., acrylate resin, methacrylate resin or polystyrene, urethane resin, polyester or polyamide are preferred. The polymers having a main chain structure of vinyl-based polymers, e.g., acrylate resin, methacrylate resin, or polystyrene are more preferred.

The polymers whose constituent having an acid radical is a polymerizable compound represented by the following formula (1) or (2) and constituent having an onium group is a polymerizable compound represented by the following formula (3), (4) or (5) are particularly preferred.

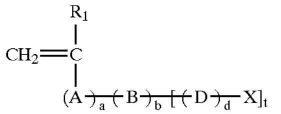

(1)

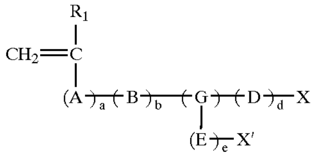

(2)

wherein A represents a divalent linking group; B represents an aromatic group or a substituted aromatic group; D and E each represents a divalent linking group; G represents a trivalent linking group; X and X' each represents an acid radical having a pKa of 7 or less, an alkali metal salt thereof or an ammonium salt thereof; $R_1$ represents a hydrogen atom, an alkyl group or a halogen atom; a, b, d and e each represents 0 or 1; and t represents an integer of from 1 to 3. The more preferred constituents having an acid radical are the constituents in which A represents —COO— or —CONH—, B represents a phenylene group or a substituted phenylene group, wherein the substituent thereof is a hydroxyl group, a halogen atom or an alkyl group, D and E each represents an alkylene group, or a divalent linking group represented by molecular formula $C_nH_{2n}O$, $C_nH_{2n}S$ or $C_nH_{2n+1}N$, G represents a trivalent linking group represented by molecular formula $C_nH_{2n-1}$, $C_nH_{2n-1}O$, $C_nH_{2n-1}S$ or $C_nH_{2n}N$, wherein n represents an integer of from 1 to 12, X and X' each represents a carboxylic acid, a sulfonic acid, a phosphonic acid, a sulfuric monoester or a phosphoric monoester, $R_1$ represents a hydrogen atom or an alkyl group, and a, b, d and e each represents 0 or 1, provided that a and b do not represent 0 at the same time. The particularly preferred constituents having an acid radical are the constituents represented by formula (1), in which B represents a phenylene group or a substituted phenylene group, wherein the substituent is a hydroxyl group, or an alkyl group having from 1 to 3 carbon atoms, D and E each represents an alkylene group having 1 or 2 carbon atoms, or an alkylene group having 1 or 2 carbon atoms linked with an oxygen atom, $R_1$ represents a hydrogen atom or an alkyl group, X represents a carboxylic acid, a represents 0, and b represents 1.

The specific examples of the constituents having an acid radical are shown below, but the present invention is not limited thereto.

Specific Examples of the Constituents Having an Acid Radical:

Acrylic acid, methacrylic acid, crotonic acid, isocrotonic acid, itaconic acid, maleic acid and maleic anhydride.

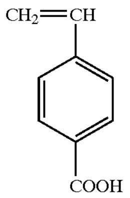

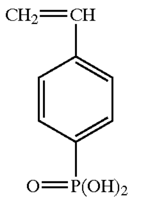

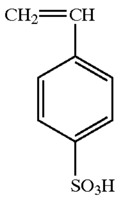

-continued

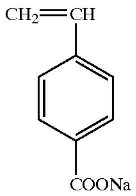

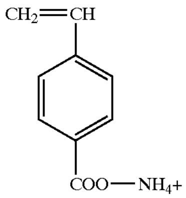

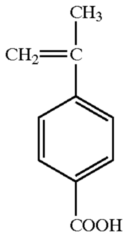

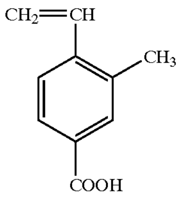

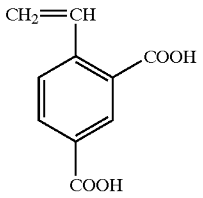

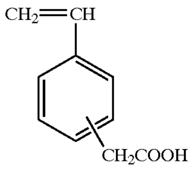

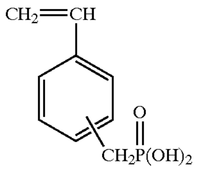

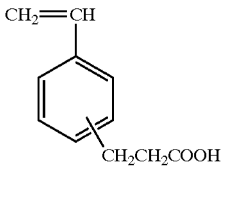

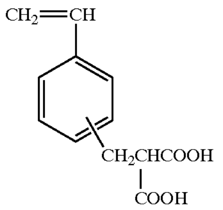

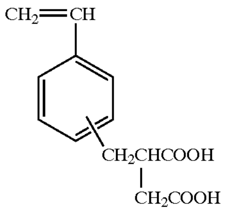

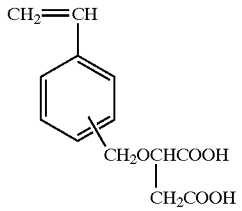

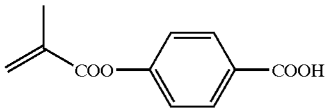

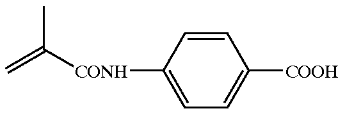

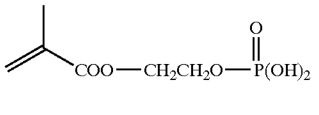

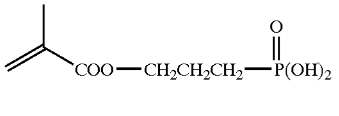

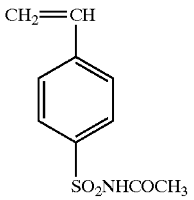

-continued

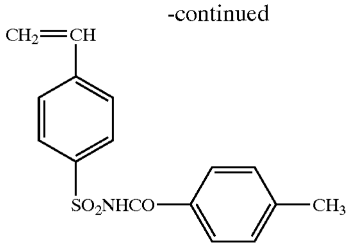

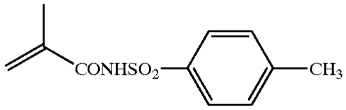

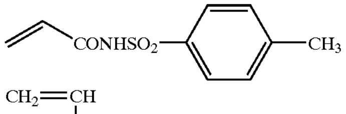

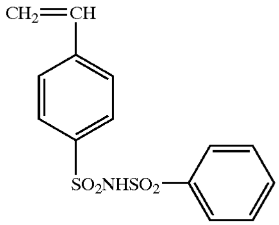

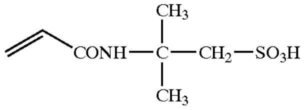

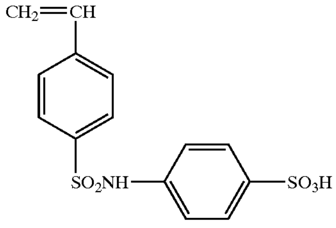

In the next place, polymerizable compounds represented by the following formula (3), (4) or (5) which are the constituents having an onium group are described below.

(3)

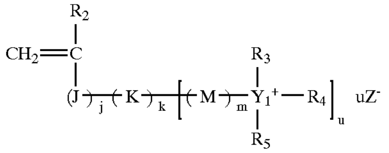

(4)

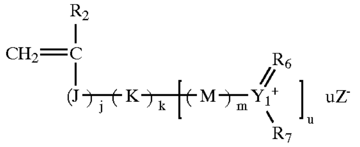

(5)

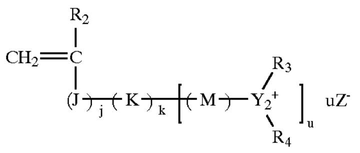

wherein J represents a divalent linking group; K represents an aromatic group or a substituted aromatic group; M represents a divalent linking group; $Y_1$ represents an atom belonging to Group V of the Periodic Table; $Y_2$ represents an atom belonging to Group VI of the Periodic Table; $Z^-$ represents a counter anion; $R_2$ represents a hydrogen atom, an alkyl group or a halogen atom; $R_3$, $R_4$, $R_5$ and $R_7$ each represents a hydrogen atom or, depending upon cases, an alkyl group to which a substituent may be bonded, an aromatic group or an aralkyl group; $R_6$ represents an alkylidene group or a substituted alkylidene group, and $R_3$ and $R_4$, or $R_6$ and $R_7$ may be bonded to each other to form a ring; j, k and m each represents 0 or 1; and u represents an integer of from 1 to 3. The more preferred constituents having an onium group are the constituents in which J represents —COO— or —CONH—, K represents a phenylene group or a substituted phenylene group, wherein the substituent thereof is a hydroxyl group, a halogen atom or an alkyl group, M represents an alkylene group, or a divalent linking group represented by molecular formula $C_nH_{2n}O$, $C_nH_{2n}S$ or $C_nH_{2n+1}N$, wherein n represents an integer of from 1 to 12, $Y_1$ represents a nitrogen atom or a phosphorus atom, $Y_2$ represents a sulfur atom, $Z^-$ represents a halogen ion, $PF_6^-$, $BF_4^-$ or $R_8SO_3^-$, $R_2$ represents a hydrogen atom or an alkyl group, $R_3$, $R_4$, $R_5$ and $R_7$ each represents a hydrogen atom or, depending upon cases, an alkyl group having from 1 to 10 carbon atoms to which a substituent may be bonded, an aromatic group or an aralkyl group, $R_6$ represents an alkylidene group having from 1 to 10 carbon atoms or a substituted alkylidene group, $R_3$ and $R_4$, or $R_6$ and $R_7$ may be bonded to each other to form a ring, j, k and m each represents 0 or 1, provided that j and k do not represent 0 at the same time, and $R_8$ represents an alkyl group having from 1 to 10 carbon atoms to which a substituent may be bonded, an aromatic group or an aralkyl group. The particularly preferred constituents having an onium group are the constituents in which K represents a phenylene group or a substituted phenylene group, wherein the substituent thereof is a hydroxyl group or an alkyl group having from 1 to 3 carbon atoms, M represents an alkylene group having 1 or 2 carbon atoms, or an alkylene group having 1 or 2 carbon atoms linked with an oxygen atom, $Z^-$ represents a chlorine ion or $R_8SO_3^-$, $R_2$ represents a hydrogen atom or a methyl group, j represents 0, k represents 1, and $R_8$ represents an alkyl group having from 1 to 3 carbon atoms.

The specific examples of the constituents having an onium group are shown below, but the present invention is not limited thereto.

Specific Examples of the Constituents Having an Onium Group:

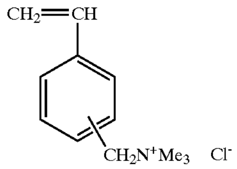

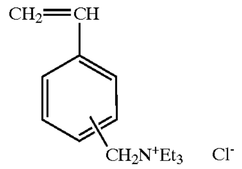

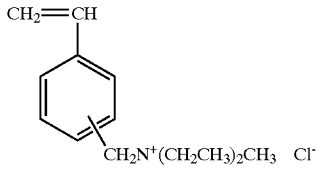

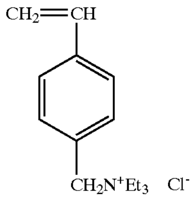

-continued

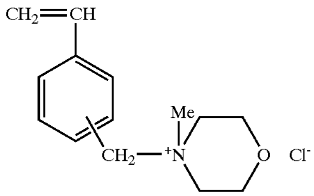

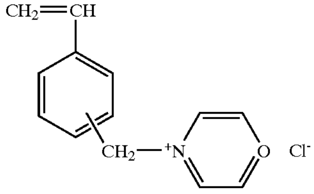

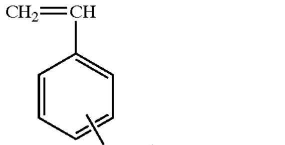

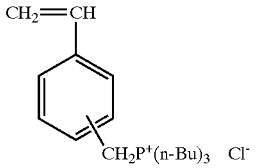

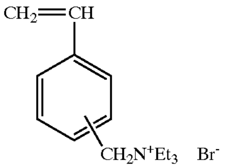

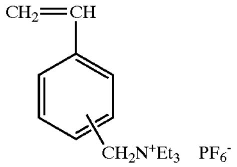

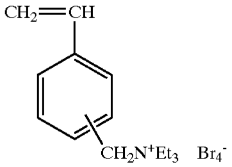

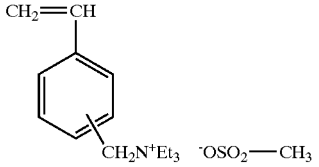

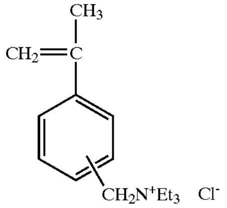

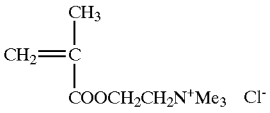

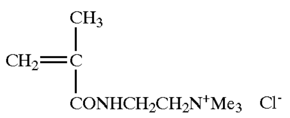

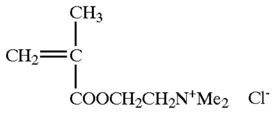

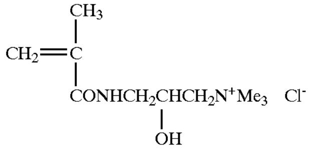

-continued

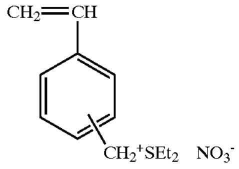

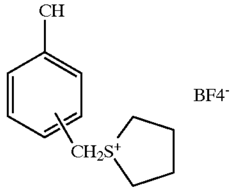

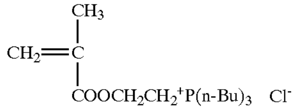

The monomer having an acid radical may be used alone, or two or more of the monomers may be used in combination. The monomer having an onium group may also be used alone, or two or more of the monomers may be used in combination. Further, the polymers in the present invention may comprise monomers alone or two or more monomers different in composition ratio or molecular weight as mixture. At this time, it is preferred that the polymer comprising a monomer having an acid radical as the polymer component contains 1 mol % or more of the monomer having an acid radical, preferably 5 mol % or more, and the polymer comprising a monomer having an onium group as the polymer component contains 1 mol % or more of the monomer having an onium group, preferably 5 mol % or more.

Further, these polymers may contain at least one monomer selected from the following polymerizable monomers (1) to (14) as the copolymer component.

(1) Acrylamides, methacrylamides, acrylic esters, methacrylic esters and hydroxystyrenes having an aromatic hydroxyl group, e.g., N-(4-hydroxyphenyl)acrylamide, N-(4-hydroxyphenyl) methacrylamide, o-, m- or p-hydroxystyrene, o- or m-bromo-p-hydroxystyrene, o- or m-chloro-p-hydroxystyrene, o-, m- or p-hydroxyphenyl acrylate or methacrylate.

(2) Unsaturated carboxylic acids, e.g., acrylic acid, methacrylic acid, maleic acid, maleic anhydride and half esters of maleic anhydride, itaconic acid, itaconic anhydride and half esters of itaconic anhydride.

(3) Acrylamides, e.g., N-(o-aminosulfonylphenyl) acrylamide, N-(m-aminosulfonylphenyl)acrylamide, N-(p-aminosulfonylphenyl)acrylamide, N-[1-(3-aminosulfonyl) naphthyl]acrylamide, and N-(2-aminosulfonylethyl) acrylamide, methacrylamides, e.g., N-(o-aminosulfonylphenyl)methacrylamide, N-(m-aminosulfonylphenyl) methacrylamide, N-(p-aminosulfonylphenyl) methacrylamide, N-[1-(3-aminosulfonyl)naphthyl] methacrylamide, and N-(2-aminosulfonylethyl) methacrylamide, unsaturated sulfonamides such as acrylic esters, e.g., o-aminosulfonylphenyl acrylate, m-aminosulfonylphenyl acrylate, p-aminosulfonylphenyl acrylate, and 1-(3-aminosulfonylphenylnaphthyl)acrylate, and unsaturated sulfonamides such as methacrylic esters, e.g., o-aminosulfonylphenyl methacrylate, m-aminosulfonylphenyl methacrylate, p-aminosulfonylphenyl methacrylate, and 1-(3-aminosulfonylphenylnaphthyl) methacrylate.

(4) Phenylsulfonylacrylamide which may have a substituent, e.g., tosylacrylamide, and phenylsulfonylmethacrylamide which may have a substituent, e.g., tosylmethacrylamide.

In addition to these monomers containing alkali-soluble groups, film-forming resins copolymerized with any of the following monomers (5) to (14) are also preferably used.

(5) Acrylic esters and methacrylic esters having an aliphatic hydroxyl group, e.g., 2-hydroxyethyl acrylate and 2-hydroxyethyl methacrylate.

(6) (Substituted) acrylicesters, e.g., methylacrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate, and N-dimethylaminoethyl acrylate.

(7) (Substituted) methacrylic esters, e.g., methyl methacrylate, ethyl-methacrylate, propyl methacrylate, butyl methacrylate, amyl methacrylate, hexyl methacrylate, cyclohexyl methacrylate, octyl methacrylate, phenyl methacrylate, benzylmethacrylate, 2-chloroethylmethacrylate, 4-hydroxybutyl methacrylate, glycidyl methacrylate, and N-dimethylaminoethyl methacrylate.

(8) Acrylamides or methacrylamides, e.g., acrylamide, methacrylamide, N-methylolacrylamide, N-methylolmethacrylamide, N-ethylacrylamide, N-ethylmethacrylamide, N-hexylacrylamide, N-hexylmethacrylamide, N-cyclohexylacrylamide, N-cyclohexylmethacrylamide, N-hydroxyethylacrylamide, N-hydroxyethylmethacrylamide, N-phenylacrylamide, N-phenylmethacrylamide, N-benzylacrylamide, N-benzylmethacrylamide, N-nitrophenylacrylamide, N-nitrophenylmethacrylamide, N-ethyl-N-phenylacrylamide and N-ethyl-N-phenylmethacrylamide.

(9) Vinyl ethers, e.g., ethyl vinyl ether, 2-chloroethyl vinyl ether, hydroxyethyl vinyl ether, propyl vinyl ether, butyl vinyl ether, octyl vinyl ether and phenyl vinyl ether.

(10) Vinyl esters, e.g., vinyl acetate, vinyl chloroacetate, vinyl butyrate and vinyl benzoate.

(11) Styrenes, e.g., styrene, α-methylstyrene, methylstyrene and chloromethylstyrene.

(12) Vinyl ketones, e.g., methyl vinyl ketone, ethyl vinyl ketone, propyl vinyl ketone and phenyl vinyl ketone.

(13) Olefins, e.g., ethylene, propylene, isobutylene, butadiene and isoprene.

(14) N-Vinylpyrrolidone, N-vinylcarbazole, 4-vinylpyridine, acrylonitrile and methacrylonitrile.

It is preferred that the polymers herein used contain 20 mol % or more of the constituent having an acid radical, preferably 40 mol % or more, and 1 mol % or more of the constituent having an onium group, preferably 5 mol % or more. When the constituent having an acid radical is contained 20 mo % or more, dissolution elimination at alkali development is more and more accelerated, and when the constituent having an onium group is contained 1 mol % or more, adhesion is further improved by the synergistic effect with the acid radical. The constituents having an acid radical may be used alone, or two or more of the constituents may be used in combination. The constituents having an onium group may also be used alone, or two or more of the constituents may be used in combination. Further, the polymers in the present invention may comprise constituents alone or two or more constituents different in composition ratio or molecular weight as mixture.

The representative examples of the polymers for use in the present invention are shown below. The ratio of the composition of each polymer structure is represented by mol %.

Specific Examples of Representative High Molecular Compound

| Structure | Number av. mol. wt. (Mn) |
| --- | --- |
| No. 1<br>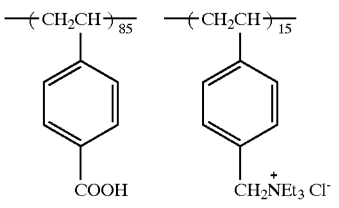 | 2,100 |
| No. 2<br>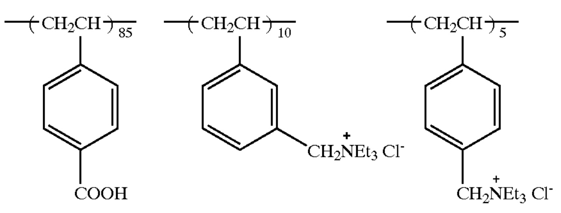 | 4,800 |

-continued
Specific Examples of Representative High Molecular Compound
| Structure | Number av. mol. wt. (Mn) |
|---|---|
| No. 3<br>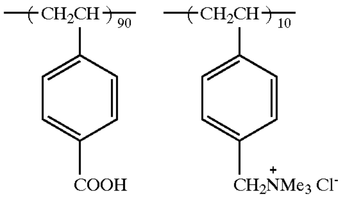 | 3,200 |
| No. 4<br>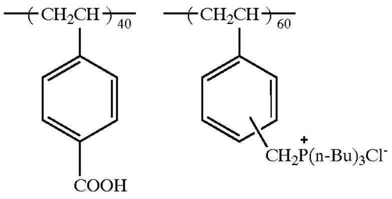 | 2,300 |
| No. 5<br>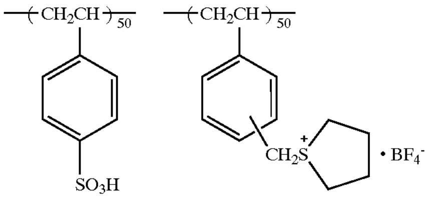 | 1,400 |
| No. 6<br>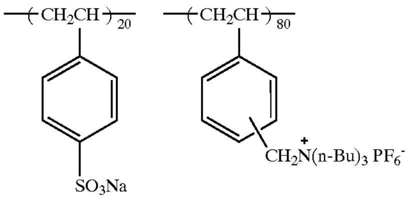 | 4,500 |
| No. 7<br>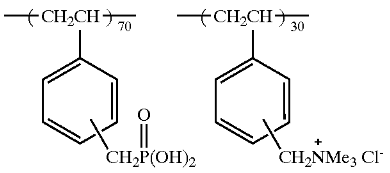 | 5,000 |
| No. 8<br>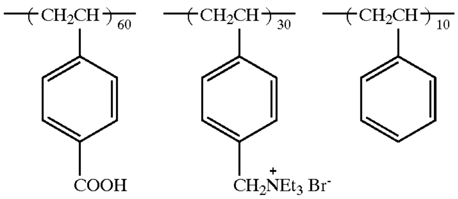 | 1,000 |

-continued
Specific Examples of Representative High Molecular Compound
| Structure | Number av. mol. wt. (Mn) |
|---|---|
| No. 9 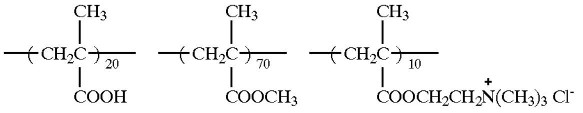 | 1,300 |
| No. 10 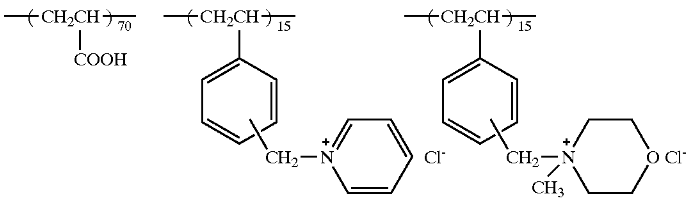 | 2,900 |
| No. 11 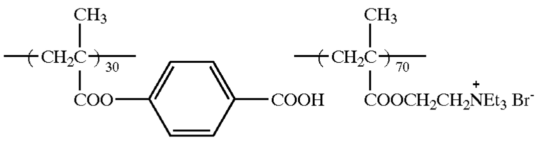 | 800 |
| No. 12 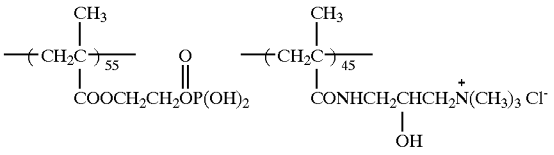 | 300 |
| No. 13 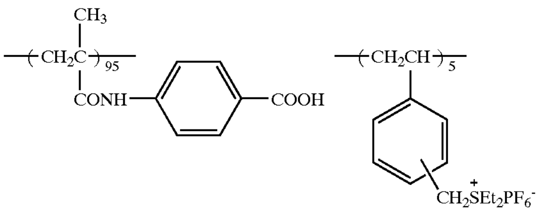 | 1,900 |
| No. 14 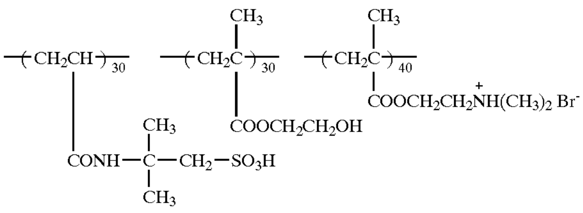 | 4,100 |

-continued
| Specific Examples of Representative High Molecular Compound | |
|---|---|
| Structure | Number av. mol. wt. (Mn) |
| No. 15<br>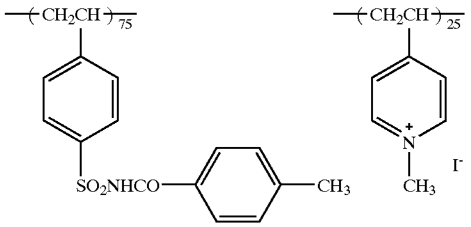 | 3,500 |
| No. 16<br>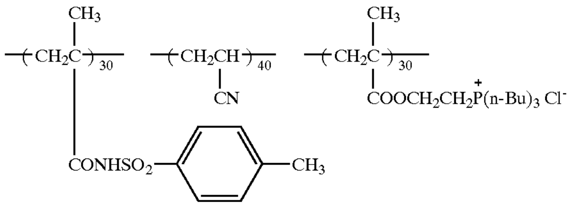 | 3,000 |
| No. 17<br>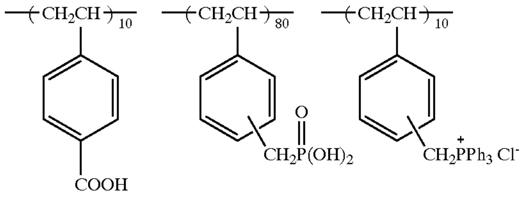 | 3,300 |
| No. 18<br>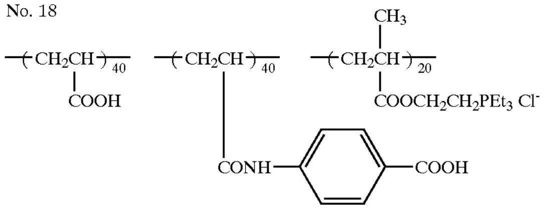 | 600 |
| No. 19<br>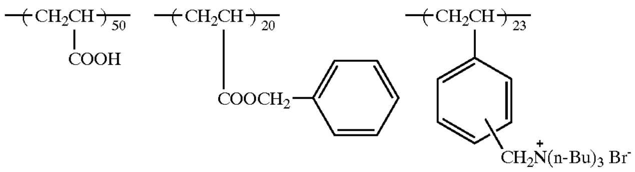 | 5,000 |
| No. 20<br>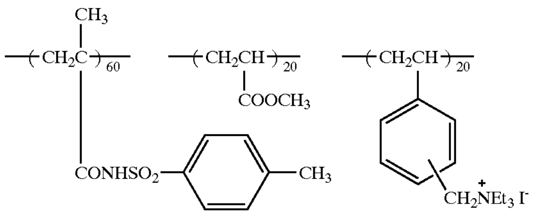 | 2,400 |

-continued

Specific Examples of Representative High Molecular Compound

| Structure | Number av. mol. wt. (Mn) |
|---|---|
| No. 21 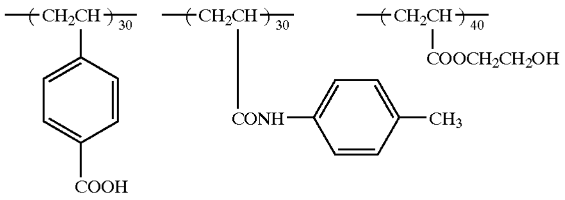 | 2,500 |
| No. 22 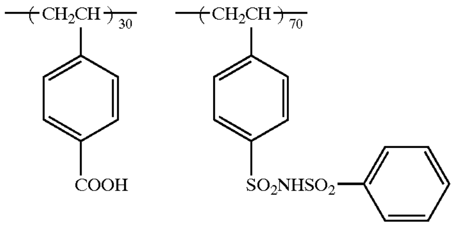 | 1,600 |
| No. 23 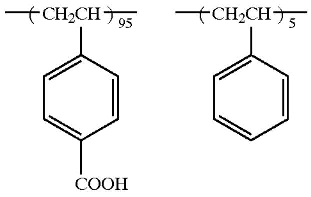 | 1,700 |
| No. 24 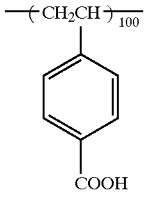 | 3,300 |

The polymers in the present invention can be generally manufactured by radical chain polymerization (see F. W. Billmeyer, *Textbook of Polymer Science,* 3rd Ed. (1984), A. Wiley-Interscience Publication).

The molecular weight of the polymers in the present invention in terms of the number average molecular weight (Mn) computed from the integrated intensity ratio of terminal groups to side chain functional groups in NMR measurement is from 300 to 100,000, preferably from 500 to 7,000, and more preferably from 1,000 to 6,000.

When the molecular weight of the polymers in the present invention is less than 300, the adhesion to the support lowers, the reproduction of fine lines and small dots results in failure, and over-development is caused with a developing solution having high activity, and when the molecular weight is higher than 100,000, the developability of the undercoating layer is disadvantageously deteriorated.

A great amount of unreacted monomers may be contained in the polymers, but the amount is preferably 20 mass % (i.e., weight %) or less, and more preferably 10 mass % or less.

The polymers having the molecular weight of the above range can be obtained by controlling the amount of a polymerization initiator and a chain transfer agent when the corresponding monomers are copolymerized.

The chain transfer agent means a substance which transfers the active site of reaction by chain transfer reaction in polymerization reaction, and the liability to the transfer reaction is expressed by a chain transfer constant Cs.

The chain transfer constant $Cs\times10^4$ (at 60° C.) of the chain transfer agent for use in the present invention is preferably 0.01 or more, more preferably 0.1 or more, and particularly preferably 1 or more.

As the polymerization initiators, polymerization initiators which are usually used in radical polymerization, e.g., peroxides, azo compounds and redox initiators can be used as they are. Of these compounds, azo compounds are particularly preferred.

The specific examples of chain transfer agents include halogen compounds, e.g., carbon tetrachloride and carbon tetrabromide; alcohols, e.g., isopropyl alcohol and isobutyl alcohol; olefins, e.g., 2-methyl-1-butene and 2,4-diphenyl- 4-methyl-1-pentene; and sulfur-containing compounds, e.g., ethanethiol, butanethiol, dodecanethiol, mercaptoethanol, mercaptopropanol, methylmercaptopropionate, ethyl mercaptopropionate, mercaptopropionic acid, thioglycollic acid, ethyl disulfide, sec-butyl disulfide, 2-hydroxyethyl disulfide, thiosalicylic acid, thiophenol, thiocresol, benzylmercaptan, and phenethylmercaptan, however, the present invention is not limited thereto.

The more preferred examples of chain transfer agents include ethanethiol, butanethiol, dodecanethiol, mercaptoethanol, mercaptopropanol, methyl mercaptopropionate, ethyl mercaptopropionate, mercaptopropionic acid, thioglycollic acid, ethyl disulfide, sec-butyl disulfide, 2-hydroxyethyl disulfide, thiosalicylic acid, thiophenol, thiocresol, benzyl mercaptan and phenethyl mercaptan, and the particularly preferred examples include ethanethiol, butanethiol, dodecanethiol, mercaptoethanol, mercaptopropanol, methyl mercaptopropionate, ethyl mercaptopropionate, mercaptopropionic acid, thioglycollic acid, ethyl disulfide, sec-butyl disulfide and 2-hydroxyethyl disulfide.

The synthesis examples of the polymers in the present invention are shown below.

SYNTHESIS EXAMPLE 1

Synthesis of Polymer No. 1 p-Vinylbenzoic acid (50.4 g) (manufactured by Hokko Kagaku Kogyo Co., Ltd.), 15.2 g of triethyl(p-vinylbenzyl) ammonium chloride, 1.9 g of mercaptoethanol, and 153.1 g of methanol were put in a three neck flask having a capacity of 2 liters, and the mixture was heated at 60° C. with being stirred under nitrogen gas flow. Dimethyl 2,2'-azobis (isobutyrate) (2.8 g) was added to the above solution and the mixture was by stirred for 30 minutes. A solution obtained by dissolving 201.5 g of p-vinylbenzoic acid, 60.9 g of triethyl(p-vinylbenzyl)ammonium chloride, 7.5 g of mercaptoethanol and 11.1 g of dimethyl 2,2'-azobis(isobutyrate) in 612.3 g of methanol was dropwise added to the above reaction solution for 2 hours. After termination of the dripping, the temperature was increased to 65° C., and stirring was continued for 10 hours under nitrogen gas flow. After termination of the reaction, the temperature of the solution was allowed to lower to room temperature. The yield of the reaction solution was 1,132 g, and the concentration of the solid content was 30.5 mass % (weight %). The number average molecular weight (Mn) of the obtained product measured by $^{13}C$-NMR spectrum was 2,100.

SYNTHESIS EXAMPLE 2

Synthesis of Polymer No. 2

A polymer having a number average molecular weight (Mn) of 4,800 was obtained in the same manner as in Synthesis Example 1 except for using triethyl (m-/p-vinylbenzyl) ammonium chloride (2/1) mixture in place of triethyl(p-vinylbenzyl)ammonium chloride, and ethyl mercaptopropionate in place of mercaptoethanol.

Other polymers in the present invention can also be synthesized in the similar manner.

Further, in addition to the above polymers, a compound represented by the following formula (6) can also be added to the photosensitive lithographic printing plate in the present invention.

$$(HO)_m\text{—}R_1\text{—}(COOH)_n \qquad (6)$$

wherein $R_1$ represents an arylene group having from 6 to 14 carbon atoms, and m and n each represents an integer of from 1 to 3.

The compound represented by formula (6) is described below.

The arylene group represented by $R_1$ has preferably from 6 to 14 carbon atoms, and more preferably from 6 to 10.

As the specific examples of the arylene group represented by $R_1$, a phenylene group, a naphthyl group, an anthryl group and a phenanthryl group are exemplified.

The arylene group represented by $R_1$ may be substituted with an alkyl group having from 1 to 10 carbon atoms, an alkenyl group having from 2 to 10 carbon atoms, an alkynyl group having from 2 to 10 carbon atoms, an aryl group having from 6 to 10 carbon atoms, a carboxylic ester group, an alkoxyl group, a phenoxy group, a sulfonic ester group, a phosphonic ester group, a sulfonylamido group, a nitro group, a nitrile group, an amino group, a hydroxyl group, a halogen atom, an ethylene oxide group, a propylene oxide group, or a triethylammonium chloride group.

The specific examples of the compounds represented by formula (6) include 3-hydroxybenzoic acid, 4-hydroxybenzoic acid, salicylic acid, 1-hydroxy-2-naphthoic acid, 2-hydroxy-1-naphthoic acid, 2-hydroxy-3-naphthoic acid, 2,4-dihydroxybenzoic acid, and 10-hydroxy-9-anthracenecarboxylic acid.

However, the specific examples are not limited to the above compounds, and the compounds represented by formula (6) can be used alone or two or more of them may be used as mixture.

The undercoating layer containing the above polymers in the present invention and, if necessary, the compounds represented by formula (6) is provided on an aluminum support subjected to hydrophilizing treatment, which is described later, by various coating methods.

The undercoating layer can be provided by the following methods.

That is, a method of coating a solution obtained by dissolving the polymers in the present invention and, if necessary, the compound represented by formula (6) in an organic solvent, e.g., methanol, ethanol or methyl ethyl ketone, or a mixed solvent of these organic solvents, or a mixed solvent of these organic solvents and water, on an aluminum support and drying, and a method of immersing an aluminum support in a solution obtained by dissolving the polymer in the present invention and, if necessary, the compound represented by formula (6) in an organic solvent, e.g., methanol, ethanol or methyl ethyl ketone, or a mixed solvent of these organic solvents, or a mixed solvent of these organic solvents and water, and then washing with water or cleaning with air and drying are exemplified.

According to the former method, the solution in concentration of from 0.005 to 10 mass % in total of the above compounds can be coated by various means. For example, any method of bar coating, rotating coating, spray coating and curtain coating may be used. In the latter method, the concentration of the solution is from 0.005 to 20 mass %, preferably from 0.01 to 10 mass %, immersion temperature is from 0 to 70° C., preferably from 5 to 60° C., and immersion time is from 0.1 seconds to 5 minutes, preferably from 0.5 to 120 seconds.

The above solution can also be used by adjusting pH to 0 to 12, preferably from 0 to 6, with basic substances, e.g., ammonia, triethylamine, and potassium hydroxide, inorganic acids, e.g., hydrochloric acid, phosphoric acid, sulfuric acid, and nitric acid, various kinds of organic acid substances such as organic sulfonic acid, e.g., nitrobenzenesulfonic acid and naphthalenesulfonic acid, organic phosphonic acids, e.g., phenylphosphonic acid, organic carboxylic acids, e.g., benzoic acid, coumaric acid, and malic acid, and organic chlorides, e.g., naphthalenesulfonyl chloride and benzenesulfonyl chloride. For improving the tone reproducibility of a photosensitive lithographic printing plate, substances which absorb ultraviolet rays, visible rays and infrared rays can be added to the solution.

The coating amount of the compounds for forming the undercoating layer in the present invention after drying is suitably from 1 to 30 $mg/m^2$, preferably from 2 to 25 $mg/m^2$, and more preferably from 4 to 20 $mg/m^2$. When the coating amount is less than 1 $mg/m^2$, a spot-shaped residual film sometimes occurs in a non-image area, and when the amount is larger than 30 $mg/m^2$, the press life is disadvantageously deteriorated.

An interlayer containing a water-insoluble and alkali-soluble resin, and a heat-sensitive layer containing a water-insoluble and alkali-soluble resin and an infrared-absorbing dye and the solubility of which in an alkali aqueous solution increases by heating are described below.

A positive heat-sensitive layer in the present invention has lamination structure comprising a heat-sensitive layer provided near the surface (exposure surface) and an interlayer containing an alkali-soluble resin provided near the support.

Both of these layers contain a water-insoluble and alkali-soluble resin and the heat-sensitive layer positioned on the upper side contains an infrared-absorbing dye. Each of the above layers to which the present invention is applied is described below.

Alkali-soluble High Polymers:

High molecular (weight) compounds insoluble in water and soluble in an alkali aqueous solution (hereinafter arbitrarily referred to as "alkali-soluble high polymers") which are used in a heat-sensitive layer and an interlayer in the present invention include homopolymers containing acid radicals in the main chain and/or side chain of the high polymers, the copolymers of these polymers, and the mixture of these polymers. Accordingly, the high polymer layers in the present invention have a characteristic that they are dissolved when they come into contact with an alkali developing solution.

The alkali-soluble high polymers which are used in an interlayer and a heat-sensitive layer of the present invention are not particularly restricted so long as they are well-known high polymers, however, they are preferably high molecular weight compounds having any functional group of (1) a phenolic hydroxyl group, (2) a sulfonamido group, and (3) an active imido group, in the molecule. For example, the following compounds are exemplified, but it should not be construed as the present invention is limited to these compounds.

(1) As the high molecular weight compounds having a phenolic hydroxyl group, novolak resins, e.g., a phenol-formaldehyde resin, an m-cresol-formaldehyde resin, a p-cresol-formaldehyde resin, an m-/p-mixed cresol-formaldehyde resin, and a phenol-cresol (any of m-, p-, and m-/p-mixed)-formaldehyde resin, and a pyrogallol-acetone resin can be exemplified. Besides the above resins, high molecular (weight) compounds having a phenolic hydroxyl group in the side chain can be preferably used as the high molecular weight compounds having a phenolic hydroxyl group. As the high molecular weight compounds having a phenolic hydroxyl group in the side chain, high molecular (weight) compounds obtained by homopolymerizing polymerizable monomers comprising low molecular weight compounds having one or more phenolic hydroxyl group(s) and one or more polymerizable unsaturated bond(s), or by copolymerizing the monomers with other monomers are exemplified.

As the polymerizable monomers having a phenolic hydroxyl group, acrylamide, methacrylamide, acrylic ester, methacrylic ester and hydroxystyrene each having a phenolic hydroxyl group can be exemplified. Specifically, N-(2-hydroxyphenyl)acrylamide, N-(3-hydroxyphenyl)acrylamide, N-(4-hydroxyphenyl)acrylamide, N-(2-hydroxyphenyl)methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate, and 2-(4-hydroxyphenyl)ethyl methacrylate can be preferably used. These resins having a phenolic hydroxyl group may be used in combination of two or more. As disclosed in U.S. Pat. No. 4,123,279, polycondensates of phenol and formaldehyde having an alkyl group having from 3 to 8 carbon atoms as the substituent, e.g., a t-butylphenol-formaldehyde resin and an octylphenol-formaldehyde resin may be used in combination.

(2) As the alkali-soluble high molecular (weight) compounds having a sulfonamido group, high molecular (weight) compounds obtained by homopolymerizing polymerizable monomers having a sulfonamido group, or by copolymerizing the monomers with other polymerizable monomers can be exemplified. As the polymerizable monomers having a sulfonamido group, polymerizable monomers comprising low molecular weight compounds having one or more sulfonamido group(s) having a nitrogen atom on which at least one hydrogen atom is bonded ($—NH—SO_2—$) and one or more polymerizable unsaturated bond(s) in one molecule are exemplified, e.g., low molecular weight compounds having an acryloyl group, an allyl group or a vinyloxy group, and a substituted or mono-substituted aminosulfonyl group or a substituted sulfonylimino group are preferred.

(3) As the polymerizable monomers having an active imido group, monomers having an imido group in the molecule are preferred, and as such high molecular weight compounds, high molecular weight compounds obtained by homopolymerizing polymerizable monomers comprising low molecular weight compounds having one or more active imido group(s) and one or more polymerizable unsaturated bond(s) in one molecule, or by copolymerizing the monomers with other polymerizable monomers can be exemplified.

As the specific examples of such compounds, N-(p-toluenesulfonyl)methacrylamide and N-(p-toluenesulfonyl)acrylamide, etc., can be preferably used.

As other alkali-soluble resins which are used in the present invention, high molecular weight compounds obtained by polymerizing two or more of the above polymerizable monomers having a phenolic hydroxyl group, polymerizable monomers having a sulfonamido group and polymerizable monomers having an active imido group, or by copolymerizing two or more of these polymerizable monomers with other polymerizable monomers are preferably used. When the polymerizable monomer having a phenolic hydroxyl group is copolymerized with the polymerizable monomer having a sulfonamido group and/or the polymerizable monomer having an active imido group, the mixing ratio of these components is preferably from 50/50 to 5/95, and particularly preferably from 40/60 to 10/90.

When the alkali-soluble high polymers are the copolymers of the above-described polymerizable monomer having a phenolic hydroxyl group, polymerizable monomer having a sulfonamido group or polymerizable monomer having an active imido group with other polymerizable monomers, it is preferred that the monomer giving alkali solubility is contained in an amount of 10 mol % or more, and more preferably 20 mol % or more. When the amount of the copolymer component is less than 10 mol %, alkali solubility is insufficient and the improving effect of development latitude becomes unsatisfactory in some cases.

As the monomer components to be copolymerized with the polymerizable monomer having a phenolic hydroxyl group, the polymerizable monomer having a sulfonamido group or the polymerizable monomer having an active imido group, e.g., the compounds described in the following (m1) to (m12) can be used but the present invention is not limited to them.

(m1) Acrylic esters and methacrylic esters having an aliphatic hydroxyl group, e.g., 2-hydroxyethyl acrylate and 2-hydroxyethyl methacrylate;

(m2) Alkyl acrylates, e.g., methyl acrylate, ethyl acrylate, propyl acrylate, butyl acrylate, amyl acrylate, hexyl acrylate, octyl acrylate, benzyl acrylate, 2-chloroethyl acrylate and glycidyl acrylate;

(m3) Alkyl methacrylates, e.g., methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, and glycidyl methacrylate;

(m4) Acrylamides or methacrylamides, e.g., acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacrylamide;

(m5) Vinyl ethers, e.g., ethyl vinyl ether, 2-chloroethyl vinyl ether, hydroxyethyl vinyl ether, propyl vinyl ether, butyl vinyl ether, octyl vinyl ether, and phenyl vinyl ether;

(m6) Vinyl esters, e.g., vinyl acetate, vinyl chloroacetate, vinyl butyrate, and vinyl benzoate;

(m7) Styrenes, e.g., styrene, α-methylstyrene, methylstyrene and chloromethylstyrene;

(m8) Vinyl ketones, e.g., methyl vinyl ketone, ethyl vinyl ketone, propyl vinyl ketone, and phenyl vinyl ketone;

(m9) Olefins, e.g., ethylene, propylene, isobutylene, butadiene and isoprene;

(m10) N-vinylpyrrolidone, acrylonitrile and methacrylonitrile;

(m11) Unsaturated imides, e.g., maleimide, N-acryloylacrylamide, N-acetylmethacrylamide, N-propionylmethacrylamide and N-(p-chlorobenzoyl) methacrylamide;

(m12) Unsaturated carboxylic acids, e.g., acrylic acid, methacrylic acid, maleic anhydride and itaconic acid.

It is preferred that the alkali-soluble high molecular (weight) compounds have a phenolic hydroxyl group in the point of being excellent in an image-forming property by infrared laser exposure, and as the preferred examples, novolak resins, e.g., a phenol-formaldehyde resin, an m-cresol-formaldehyde resin, a p-cresol-formaldehyde resin, an m-/p-mixed cresol-formaldehyde resin, and a phenol-cresol (any of m-, p-, and m-/p-mixed)-formaldehyde resin, and a pyrogallol-acetone resin are exemplified.

As the alkali-soluble high molecular weight compounds having a phenolic hydroxyl group, polycondensates of phenol and formaldehyde having an alkyl group having from 3 to 8 carbon atoms as the substituent, e.g., a t-butylphenol-formaldehyde resin and an octylphenol-formaldehyde resin as disclosed in U.S. Pat. No. 4,123,279 are exemplified.

As the copolymerization methods of the alkali-soluble high molecular weight compounds, conventionally well-known graft copolymerization, block copolymerization and random copolymerization methods can be used.

When the alkali-soluble high polymers are the homopolymers or the copolymers of polymerizable monomer having a phenolic hydroxyl group, polymerizable monomer having a sulfonamido group or polymerizable monomer having an active imido group, the weight average molecular weight of the alkali-soluble high polymers is preferably 2,000 or more, and the number average molecular weight is preferably 500 or more. More preferably, the weight average molecular weight is from 5,000 to 300,000, the number average molecular weight is from 800 to 250,000, and the degree of dispersion (weight average molecular weight/number average molecular weight) is from 1.1 to 10.

Further, when the alkali-soluble high polymers are resins, e.g., phenol-formaldehyde resins or cresol-formaldehyde resins, the weight average molecular weight of the alkali-soluble high polymers is preferably from 500 to 20,000, and the number average molecular weight is preferably from 200 to 10,000.

As the alkali-soluble high polymers which are used in an interlayer, acrylate resins are preferred from the viewpoint of image formation at development, since they can satisfactorily maintain the solubility of an interlayer in an alkali developing solution. Acrylate resins having a sulfoamido group are particularly preferred.

As the alkali-soluble high polymers which are used in the heat-sensitive layer, resins having a phenolic hydroxyl group are preferred in that an image-forming property are improved, because high hydrogen bonding is brought about in an unexposed area, partial hydrogen bonding is easily released in an exposed area, and the difference in the developability to a developing solution in an unexposed area and an exposed area is great. Novolak resins are further preferred.

These alkali-soluble high polymers may be used alone or in combination of two or more kinds, and they are used in an addition amount of from 30 to 99 mass % of the total solid contents of the heat-sensitive layer, preferably from 40 to 95 mass %, and particularly preferably from 50 to 90 mass %. When the addition amount of the alkali-soluble high polymers is less than 30 mass %, the durability of the heat-sensitive layer is deteriorated, on the other hand when it exceeds 99 mass %, the sensitivity and durability are both disadvantageously lowered.

Infrared-absorbing Dyes:

The infrared-absorbing dyes which are used in the heat-sensitive layer in the present invention are not particularly so long as they are dyes which absorb infrared rays and generate heat. Various kinds of dyes which are known as infrared-absorbing dyes can be used in the present invention.

As the infrared-absorbing dyes used in the present invention, commercially available dyes and well-known dyes described, e.g., in *Senryo Binran* (*Dye Handbook*), compiled by Yuki Gosei Kagaku Kyokai (1970) can be used. The specific examples of these dyes include azo dyes, metal complex azo dyes, pyrazolone azo dyes, anthraquinone dyes, phthalocyanine dyes, carbonium dyes, quinoneimine dyes, methine dyes and cyanine dyes. Of the above-described dyes, cyanine series dyes which absorb infrared rays or near infrared rays are particularly preferably used in the point that they are suitable for use in lasers which emit infrared rays or near infrared rays.

As dyes which absorb infrared rays or near infrared rays, e.g., the cyanine dyes disclosed in Japanese Patent Laid-Open Nos. 125246/1983, 84356/1984, 202829/1984 and 78787/1985, the methine dyes disclosed in Japanese Patent Laid-Open (Application) Nos. 173696/1983, 181690/1983 and 194595/1983, the naphthoquinone dyes disclosed in Japanese Patent Laid-Open Nos. 112793/1983, 224793/1983, 48187/1984, 73996/1984, 52940/1985 and 63744/1985, the squarylium dyes disclosed in Japanese Patent Laid-Open No. 112792/1983, and the cyanine dyes disclosed in British Patent 434,875 can be exemplified.

Further, the near infrared-absorbing sensitizers disclosed in U.S. Pat. No. 5,156,938 are also preferably used. In addition, the substituted arylbenzo(thio)pyrylium salts disclosed in U.S. Pat. No. 3,881,924, the trimethine thiapyrylium salts disclosed in Japanese Patent Laid-Open No. 142645/1982 (corresponding to U.S. Pat. No. 4,327,169), the pyrylium series compounds disclosed in Japanese Patent Laid-Open Nos. 181051/1983, 220143/1983, 41363/1984, 84248/1984, 84249/1984, 146063/1984 and 146061/1984, the cyanine dyes disclosed in Japanese Patent Laid-Open No. 216146/1984, the pentamethine thiopyrylium salts disclosed in U.S. Pat. No. 4,283,475, the pyrylium compounds disclosed in Japanese Patent Publication Nos. 13514/1993 and 19702/1993 are particularly preferably used, and Epolite III-178, Epolite III-130, and Epolite III-125 (manufactured by Epoline) are particularly preferably used as commercially available products.

As other examples of particularly preferred dyes, the near infrared-absorbing dyes represented by formulae (I) and (II) disclosed in U.S. Pat. No. 4,756,993 can be exemplified.

These infrared-absorbing dyes may be added not only to a single heat-sensitive layer but a plurality of heat-sensitive layers, to thereby function as heat-sensitive layers. In such a case, the same one infrared-absorbing dye may be added to respective heat-sensitive layers or different dyes may be added.

When the heat-sensitive layer comprises a plurality of layers, these layers are preferably adjacent to each other. Further, it is preferred that infrared-absorbing dyes and alkali-soluble resins are contained in the same layer but they may be added to different layers.

These infrared-absorbing dyes can be added to printing plate materials in a proportion of from 0.01 to 50 mass % based on the total solid contents of the material, preferably from 0.1 to 10 mass %, and particularly preferably from 0.5 to 10 mass %. When the addition amount of the dyes is less than 0.01 mass %, the sensitivity lowers, and when it exceeds 50 mass %, the uniformity of the heat-sensitive layer is lost and the durability of the heat-sensitive layer is deteriorated.

Other Components:

In forming a heat-sensitive layer or an interlayer, various additives can be added in addition to the above essential components, if necessary, so long as the effects of the present invention are not hindered. Additives may be added to only an interlayer, or may be added to only a heat-sensitive layer, or may be added to both layers. Additives are described below by examples.

For example, such additives include thermal-decomposable compounds such as onium salts, o-quinonediazide compounds, aromatic sulfone compounds, and aromatic sulfonic ester compounds. It is preferred to use in combination of a substance which, in the state of not being decomposed, substantially lowers the solubility of the high molecular weight compounds which are soluble in an alkali aqueous solution with a view to improving the inhibition of dissolution of an image area in a developing solution. As such onium salts, a diazonium salt, an ammonium salt, a phosphonium salt, an iodonium salt, a sulfonium salt, a selenonium salt, and an arsonium salt are exemplified.

The examples of onium salts preferably used in the present invention include, e.g., the diazonium salts described in S. I. Schlesinger, *Photogr. Sci. Eng.,* 18, 387 (1974), T. S. Bal et al., *Polymer,* 21, 423 (1980), and Japanese Patent Laid-Open No. 158230/1993; the ammonium salts disclosed in U.S. Pat. Nos. 4,069,055, 4,069,056, and Japanese Patent Laid-Open No. 140140/1991; the phosphonium salts described in D. C. Necker et al., *Macromolecules,* 17, 2468 (1984), C. S. Wen et al., *Teh, Proc. Conf. Rad. Curing ASIA*, p. 478, Tokyo, October (1988), U.S. Pat. Nos. 4,069,055 and 4,069,056; the iodonium salts described in J. V. Crivello et al., *Macromolecules,* 10 (6), 1307 (1977), *Chem. & Eng. News*, November 28, p. 31 (1988), EP 104143, U.S. Pat. Nos. 339,049, 410,201, Japanese Patent Laid-Open Nos. 150848/1990 and 296514/1990; the sulfonium salts described in J. V. Crivello et al., *Polymer J.,* 17, 73 (1985), J. V. Crivello et al., *J. Org. Chem.,* 43, 3055 (1978), W. R. Watt et al., *J. Polymer Sci.*, Polymer Chem. Ed., 22, 1789 (1984), J. V. Crivello et al., *Polymer Bull.,* 14, 279 (1985), J. V. Crivello et al., *Macromolecules,* 14 (5), 1141 (1981), J. V. Crivello et al., *Polymer Sci.*, Polymer Chem. Ed., 17, 2877 (1979), EP 370693, EP 233567, EP 297443, EP 297442, U.S. Pat. Nos. 4,933,377, 3,902,114, 410,201, 339,049, 4,760,013, 4,734,444, 2,833,827, German Patents 2,904,626, 3,604,580 and 3,604,581; the selenonium salts described in J. V. Crivello et al., *Macromolecules,* 10 (6), 1307 (1977), and J. V. Crivello et al., *J. Polymer Sci.*, Polymer Chem. Ed., 17, 1047 (1979); and the arsonium salts described in C. S. Wen et al., *Teh, Proc. Conf. Rad. Curing ASIA*, p. 478, Tokyo, October (1988).

Of these onium salts, diazonium salts are particularly preferred. As particularly preferred diazonium salts, those disclosed in Japanese Patent Laid-Open (Application) No. 158230/1993 are exemplified.

As the counter ions of onium salts, tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoylbenzenesulfonic acid, and paratoluenesulfonic acid can be exemplified. Of these compounds, hexafluorophosphoric acid, triisopropylnaphthalenesulfonic acid, and alkyl aromatic sulfonic acid such as 2,5-dimethylbenzenesulfonic acid are preferred.

Preferred quinonediazide compounds are o-quinonediazide compounds. The o-quinonediazide compounds used in the present invention are compounds having at least one o-quinonediazido group, the alkali solubility of which is increased by thermal decomposition, and compounds of various structures can be used. That is, o-quinonediazide loses the function of inhibiting dissolution of a binder by thermal decomposition and o-quinonediazide per se converts to an alkali-soluble substance, thereby assists the dissolubility of photosensitive materials. o-Quinonediazide compounds which are described, e.g., in J. Kosar, *Light-Sensitive Systems*, pp. 339 to 352, John Wiley & Sons, Inc. can be used in the present invention. Sulfonic esters or sulfonic acid amides of o-quinonediazide obtained by the reaction with various aromatic polyhydroxyl compounds or aromatic amino compounds are particularly preferred. Further, esters of benzoquinone-(1,2)-diazidosulfonic acid chloride or naphthoquinone-(1,2)-diazido-5-sulfonic acid chloride and pyrogallol-acetone resins as disclosed in Japanese Patent Publication No. 28403/1968, and esters of benzoquinone-(1,2)-diazidosulfonic acid chloride or naphthoquinone-(1,2)-diazido-5-sulfonic acid chloride and phenol-formaldehyde resins as disclosed in U.S. Pat. Nos. 3,046,120 and 3,188,210 are also preferably used.

Further, esters of naphthoquinone-(1,2)-diazido-4-sulfonic acid chloride and phenol-formaldehyde resins or cresol-formaldehyde resins, and esters of naphthoquinone-(1,2)-diazido-4-sulfonic acid chloride and pyrogallol-acetone resins are also preferably used in the present invention. As other useful o-quinonediazide compounds, those disclosed in the following patents are exemplified: Japanese Patent Laid-Open Nos. 5303/1972, 63802/1973, 63803/1973, 96575/1973, 38701/1974, 13354/1973, Japanese Patent Publication Nos. 11222/1966, 9610/1970, 17481/1974, U.S. Pat. Nos. 2,797,213, 3,454,400, 3,554,323, 3,573,917, 3,674,495, 3,785,825, British Patents 1,227,602, 1,251,345, 1,267,005, 1,329,888, 1,330,932, and German Patent 854,890.

The addition amount of o-quinonediazide compounds is preferably from 1 to 50 mass %, more preferably from 5 to 30 mass %, and particularly preferably from 10 to 30 mass %, based on the total solid contents forming the layer. o-Quinonediazide compounds can be used alone or they may be used as mixtures of two or more.

The addition amount of the additives other than o-quinonediazide compounds is preferably from 1 to 50 mass %, more preferably from 5 to 30 mass %, and particularly preferably from 10 to 30 mass %. The additives in the present invention and the alkali-soluble high polymers are preferably added to the same layer.

For the purpose of heightening discrimination of images and improving resistance to scratches of the surface, it is preferred to use polymers comprising (meth)acrylate homopolymer having two or three perfluoroalkyl groups having from 3 to 20 carbon atoms in the molecule as the polymer component in combination as disclosed in Japanese Patent Laid-Open No. 187318/2000. Such compounds may be added to either an interlayer or a heat-sensitive layer, but it is more effective to add them to a heat-sensitive layer which is positioned on the upper side.

The addition amount of these polymers is preferably in the proportion of from 0.1 to 10 mass % in a heat-sensitive layer, and more preferably from 0.5 to 5 mass %.

The lithographic printing plate materials in the present invention can contain a compound which lowers the static friction coefficient of the surface for the purpose of imparting scratch resistance. Specifically, long chain alkylcarboxylic acid esters as disclosed in U.S. Pat. No. 6,117,913 can be exemplified. Such compounds may be added to either an interlayer or a heat-sensitive layer, but it is more effective to add them to a heat-sensitive layer which is positioned on the upper side.

The addition amount of these compounds is preferably in the proportion of from 0.1 to 10 mass % in the material forming the layer, and more preferably from 0.5 to 5 mass %.

An interlayer or a heat-sensitive layer in the present invention may contain, if necessary, compounds having a low molecular weight acidic group. As the acidic groups, a sulfonic acid, a carboxylic acid and a phosphoric acid group can be exemplified. Compounds having a sulfonic acid group are preferred above all. Specifically, aromatic sulfonic acids, e.g., a p-toluenesulfonic acid and a naphthalenesulfonic acid, and aliphatic sulfonic acids are exemplified.

Such compounds may be added to either an interlayer or a heat-sensitive layer. The addition amount of these compounds is preferably in the proportion of from 0.05 to 5 mass % in the material forming the layer, and more preferably from 0.1 to 3 mass %. When the amount is higher than 5 mass %, the solubility of each layer in a developing solution disadvantageously increases.

Further, an interlayer or a heat-sensitive layer in the present invention may contain various kinds of dissolution inhibitors for the purpose of controlling the solubility of an interlayer or a heat-sensitive layer. Dissolution inhibitors as disclosed in Japanese Patent Laid-Open No. 119418/1999 are preferably used, specifically it is preferred to use 4,4'-bis-hydroxyphenylsulfone.

Such compounds may be added to either an interlayer or a heat-sensitive layer. The addition amount of these compounds is preferably in the proportion of from 0.05 to 20 mass % in the material forming the layer, and more preferably from 0.5 to 10 mass %.

For increasing sensitivity, cyclic acid anhydrides, phenols and organic acids can also be used in combination. The examples of cyclic acid anhydrides include, as disclosed in U.S. Pat. No. 4,115,128, phthalic anhydride, tetrahydrophthalic anhydride, hexahydrophthalic anhydride, 3,6-endoxy-Δ4-tetrahydrophthalic anhydride, tetrachlorophthalic anhydride, maleic anhydride, chloromaleic anhydride, α-phenylmaleic anhydride, succinic anhydride, and pyromellitic anhydride. The examples of phenols include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, and 4,4',3",4"-tetrahydroxy-3,5,3',5'-tetramethyltriphenylmethane. Further, the examples of organic acids include, as disclosed in Japanese Patent Laid-Open Nos. 88942/1985 and 96755/1990, sulfonic acids, sulfinic acids, alkylsulfuric acids, phosphonic acids, phosphoric esters, and carboxylic acids, specifically, p-toluenesulfonic acid, dodecylbenzenesulfonic acid, p-toluenesulfinic acid, ethyl sulfate, phenyl phosphonate, phenyl phosphinate, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid can be exemplified. The content of cyclic acid anhydrides, phenols and organic acids in the material forming the layer is preferably from 0.05 to 20 mass %, more preferably from 0.1 to 15 mass %, and particularly preferably from 0.1 to 10 mass %.

For widening the processing stability to development conditions, an interlayer or a heat-sensitive layer in the present invention can contain nonionic surfactants as disclosed in Japanese Patent Laid-Open Nos. 251740/1987 and 208514/1991, ampholytic surfactants as disclosed in Japanese Patent Laid-Open Nos. 121044/1984 and 13149/1992, siloxane series compounds as disclosed in EP 950517, and copolymers of fluorine-containing monomers as disclosed in Japanese Patent Laid-Open No. 288093/1999.

The specific examples of nonionic surfactants include sorbitan tristearate, sorbitan monopalmitate, sorbitan trioleate, stearic acid monoglyceride, polyoxyethylenenonylphenyl ether, etc., and the specific examples of ampholytic surfactants include alkyldi(aminoethyl)glycine, alkylpolyaminoethylglycine hydrochloride, 2-alkyl-N-carboxyethyl-N-hydroxyethylimidazoliniumbetaine, N-tetradecyl-N,N-betaine type (e.g., Amorgen K, trade name, manufactured by Daiichi Kogyo Seiyaku Co., Ltd.), etc.

As the siloxane series compounds, block copolymers of dimethylsiloxane and polyalkylene oxide are preferably used, and as the specific examples, polyalkylene oxide-modified silicone, e.g., DBE-224, DBE-621, DBE-712, DBP-732 and DBP-534 (manufactured by Chisso), and Tego Glide 100 (manufactured by Tego AG, Germany) are exemplified.

The content of nonionic surfactants and ampholytic surfactants is in the proportion of preferably from 0.05 to 15 mass % in coating solution materials, and more preferably from 0.1 to 5 mass %.

Printing out agents for obtaining visible images immediately after heating by exposure, and dyes and pigments as coloring agents of images can be added to an interlayer or a heat-sensitive layer in the present invention.

As the printing out agent, combinations of compounds which release an acid upon heating by exposure (light-acid releasing agents) with the organic dyes which can form a salt can be exemplified as representatives. Specifically, the combinations of o-naphthoquinonediazide-4-sulfonic acid halogenide with salt-forming organic dyes disclosed in Japanese Patent Laid-Open Nos. 36209/1975 and 8128/1978, and trihalomethyl compounds with salt-forming organic dyes disclosed in Japanese Patent Laid-Open Nos. 36223/1978, 74728/1979, 3626/1985, 143748/1986, 151644/1986 and 58440/1988 can be exemplified. As such trihalomethyl compounds, there are oxazole compounds and triazine compounds and both are excellent in storage stability and clear printing out image can be obtained.

As coloring agents of images, other dyes can be used besides the above-described salt-forming organic dyes. Oil-soluble dyes and basic dyes can be exemplified as appropriate dyes including the salt-forming organic dyes. Specifically, Oil Yellow #101, Oil Yellow #103, Oil Pink #312, Oil Green BG, Oil Blue BOS, Oil Blue #603, Oil Black BY, Oil Black BS, Oil Black T-505 (products of Orient Kagaku Kogyo Co., Ltd.), Victoria Pure Blue, Crystal Violet (C.I. 42555), Methyl Violet (C.I. 42535), Ethyl Violet, Rhodamine B (C.I. 145170B), Malachite Green (C.I. 42000), and Methylene Blue (C.I. 52015) can be exemplified. Further, the dyes disclosed in Japanese Patent Laid-Open No. 293247/1987 are particularly preferably used as coloring agents of images. These dyes can be added to printing plate materials in an amount of from 0.01 to 10 mass %, preferably from 0.1 to 3 mass %, based on the entire solid contents of the printing plate materials. Further, if necessary, plasticizers are added to the printing plate materials in the present invention for providing flexibility to coating layers. For example, butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers and polymers of acrylic acid or methacrylic acid, etc., are used for this purpose.

The heat-sensitive layer and the interlayer in the lithographic printing plate of the present invention can be formed generally by dissolving the above-described each component in a solvent and coating the obtained coating solution on an appropriate support.

The examples of solvents used herein include ethylene dichloride, cyclohexanone, methyl ethyl ketone, methanol, ethanol, propanol, ethylene glycol monomethyl ether, 1-methoxy-2-propanol, 2-methoxyethylacetate, 1-methoxy-2-propylacetate, dimethoxyethane, methyl lactate, ethyl lactate, N,N-dimethylacetamide, N,N-dimethylformamide, tetramethylurea, N-methylpyrrolidone, dimethyl sulfoxide, sulforan, γ-butyrolactone, toluene, etc., but solvents are not limited thereto. These solvents are used alone or in mixture.

As the solvents used in the coating, it is preferred to select solvents having different solubilities in the alkali-soluble high polymers for use in the heat-sensitive layer and in the alkali-soluble high polymers for use in the interlayer. That is, when the interlayer has been coated and then the upper heat-sensitive layer is coated adjacently to the interlayer, if a solvent which dissolves the alkali-soluble high polymer in the interlayer is used as the coating solvent of the upper heat-sensitive layer, the mixture at interface comes to a problem not negligible, and in an extreme case, the heat-sensitive layer does not become multilayer structure and becomes a uniform single layer. When the mixture is caused at the interface between two adjacent layers and two layers are compatibilized and show the behavior as a uniform layer, there is the possibility that the effect of the present invention by virtue of the provision of two layers is impaired. Therefore, the solvent for coating the upper heat-sensitive layer is preferably a poor solvent to the alkali-soluble high polymer contained in the interlayer.

The concentration of the above components (the entire solid contents inclusive of additives) in a solvent at the time of coating each layer is preferably from 1 to 50 mass %.

Although the coating amounts (the solid contents) of the heat-sensitive layer and the interlayer on the support obtained after coating and drying vary depending upon the purpose, the coating amount of the heat-sensitive layer is preferably from 0.05 to 1.0 $g/m^2$, and that of the interlayer is preferably from 0.3 to 3.0 $g/m^2$. When the coating amount of the heat-sensitive layer is less than 0.05 $g/m^2$, the image-forming property lowers and when the amount exceeds 1.0 $g/m^2$, there is the possibility of the reduction of sensitivity. When the coating amount of the interlayer is out of the above range, even when it is too little or too much, the image-forming property is liable to lower. The coating amount of the two layers in total is preferably from 0.5 to 3.0 $g/m^2$. When the total amount is less than 0.5 $g/m^2$, the film characteristics lower and when it exceeds 3.0 $g/m^2$, the sensitivity is liable to lower. As the coating amount decreases, apparent sensitivity increases but film characteristics of a photosensitive film lower.

Various coating methods can be used, e.g., bar coating, rotary coating, spray coating, curtain coating, dip coating, air knife coating, blade coating, and roll coating can be used.

For improving coating property, the heat-sensitive layer and the interlayer in the present invention can contain surfactants, e.g., fluorine-containing polymers. As the fluorine-containing polymers, fluorine-containing polymers as disclosed in Japanese Patent Laid-Open Nos. 288093/1999 and 187318/2000 are exemplified. As the specific examples of preferred polymers, the fluorine-containing polymers obtained by copolymerizing the fluorine-containing acryl series polymers P-1 to P-13 disclosed in Japanese Patent Laid-Open No. 288093/1999 and the fluorine-containing acryl series monomers A-1 to A-33 disclosed in Japanese Patent Laid-Open No. 187318/2000 with arbitrary acryl monomers can be exemplified.

The above fluorine-containing polymers having a weight average molecular weight of 2,000 or higher and a number average molecular weight of 1,000 or higher are preferably used, and more preferably a number average molecular weight of from 5,000 to 300,000 and a number average molecular weight of from 2,000 to 250,000.

As the fluorine-containing polymers, commercially available fluorine-containing surfactants having the above preferred range of molecular weights can be used in the present invention. The specific examples of the commercially available products include Megafac F-171, F-173, F-176, F-183 and F-184 (manufactured by Dainippon Ink & Chemicals, Inc.).

These fluorine-containing polymers may be used alone or may be used in combination of two or more.

The addition amount of the fluorine-containing polymers to the heat-sensitive layer and the interlayer is preferably 1.4 mass % or more based on the solid content in each layer, and more preferably from 1.4 to 5.0 mass %. When the addition amount is less than 1.4 mass %, it becomes hard to suppress the influence on development latitude. Even if the addition amount exceeds 5.0 mass %, a further improving effect of development latitude cannot be expected, on the contrary, sparing dissolution of the heat-sensitive layer surface proceeds by the influence of the fluorine-containing polymers, and there arises the possibility of the reduction of sensitivity.

Support:

As the support for the heat-sensitive lithographic printing plate in the present invention, aluminum plates which are dimensionally stable and relatively inexpensive are preferably used. Preferred aluminum plates are a pure aluminum plate and an aluminum alloy plate comprising aluminum as a main component and a trace amount of foreign elements. Plastic films laminated or deposited with aluminum may also be used. Foreign elements which may be contained in aluminum alloys are silicon, iron, manganese, copper, magnesium, chromium, zinc, bismuth, nickel, titanium, etc. The content of foreign elements in aluminum alloys is at most 10 mass %. Particularly preferred aluminum for use in the present invention are pure aluminum but 100% pure aluminum is difficult to produce from the refining technique, accordingly an extremely small amount of foreign elements may be contained.

The compositions of aluminum plates used in the present invention are not specified, and conventionally well-known and commonly used aluminum materials can be used arbitrarily. The thickness of aluminum plates which are used in the present invention is from about 0.1 to about 0.6 mm, preferably from 0.15 to 0.4 mm, and particularly preferably from 0.2 to 0.3 mm.

Prior to surface roughening of an aluminum plate, if desired, degreasing treatment for removing the rolling oil on the surface of a plate is conducted using, for example, a surfactant, an organic solvent or an alkaline aqueous solution. Surface roughening treatment of an aluminum plate can be performed by various methods, e.g., mechanical surface roughening, electrochemical roughening by dissolving the surface, and chemical roughening by selectively dissolving the surface. As mechanical surface roughening, well-known methods, e.g., a ball polishing method, a brush polishing method, a blast polishing method, or a buff polishing method, can be used. As electrochemical surface roughening, a method of roughening the surface in a hydrochloric acid or nitric acid electrolyte by alternating current or direct current can be used. Further, as disclosed in 63902/1979, a method of combination of mechanical roughening with electrochemical roughening can also be used. The thus-surface roughened aluminum plate is subjected to anodic oxidation treatment for increasing water retentive property and abrasion resistance of the surface, if necessary, after being subjected to alkali-etching treatment and neutralizing treatment. Various electrolytes which form a porous oxide film are applicable as the electrolyte for use in the anodic oxidation treatment of aluminum plates, e.g., sulfuric acid, phosphoric acid, oxalic acid, chromic acid or mixed acids of these acids are generally used. The concentration of electrolytes is determined arbitrarily depending upon the kind of the electrolytes.

Treatment conditions of anodic oxidation cannot be determined unconditionally as conditions fluctuate variously depending upon the electrolyte to be used, but generally appropriately the concentration of an electrolyte is from 1 to 80 wt %, temperature of the solution is from 5 to 70° C., electric current density is from 5 to 60 A/dm$^2$, voltage is from 1 to 100 V, and electrolytic time is from 10 seconds to 5 minutes. An anodic oxide film is preferably from 1 to 10 g/m$^2$. If the amount of an anodic oxide film is less than 1.0 g/m$^2$, press life comes to be insufficient and the non-image area of the lithographic printing plate is liable to be scratched, as a result, "scratch stain", i.e., adhesion of ink at that scratch during printing, is liable to occur. After anodic oxidation treatment, the aluminum surface is subjected to hydrophilization treatment, if necessary. As preferred hydrophilization treatments to be used in the present invention, there is a method of treatment with alkali metal silicate (e.g., a sodium silicate aqueous solution) as disclosed in U.S. Pat. Nos. 2,714,066, 3,181,461, 3,280,734 and 3,902,734. In this method, a support is immersed and treated in a sodium silicate aqueous solution or electrolytically treated. As other methods, treatment with potassium fluorozirconate as disclosed in Japanese Patent Publication No. 22063/1961, and treatment with polyvinylsulfonic acid as disclosed in U.S. Pat. Nos. 3,276,868, 4,153,461 and 4,689,272 are used.

The support in the present invention is obtained as described above, and the ratio of the actual area to the apparent area of the surface of the support is preferably from 1.3 to 1.8 times, more preferably from 1.3 to 1.6 times. Thus, a lithographic printing plate excellent in adhesion of the interlayer and the support and in press life can be obtained.

Further, a lithographic printing plate having a heat-sensitive layer with a smooth surface can be obtained when the support has pits on the surface having an average diameter of preferably from 0.3 to 1.0 $\mu$m, particularly preferably from 0.3 to 0.8 $\mu$m, and an average depth of preferably from 0.05 to 0.4 $\mu$m, particularly preferably from 0.05 to 0.3 $\mu$m, and more preferably when the inside of the pit is the structure provided with minute unevenness of the wavelength of preferably from 0.005 to 0.1 $\mu$m, particularly preferably from 0.05 to 0.1 $\mu$m.

Further, the support used in the present invention has the ratio of the apparent area of the pits to the apparent area of the surface of 90% or more, particularly preferably 95% or more, thus, a lithographic printing plate excellent in adhesion of the undercoating layer and the support and in press life can be obtained.

The lithographic printing plate in the present invention obtained by laminating a specific undercoating layer, an interlayer, and a heat-sensitive layer in this order on the support for a lithographic printing plate is subjected to imagewise exposure and then development process.

As the light sources of actinic rays used for image exposure, e.g., a mercury lamp, a metal halide lamp, a xenon lamp, a chemical lamp and a carbon arc lamp are used. Radiation includes electron beams, X-rays, ion beams and far infrared rays. Further, g-rays, i-rays, Deep-UV rays, high density energy beams (laser beams) can also be used. As laser beams, e.g., a helium-neon laser, an argon laser, a krypton laser, a helium-cadmium laser and a KrF excimer laser are exemplified.

Light sources having light emission wavelength at near infrared to infrared are preferably used in the present invention, and a solid state laser and a semiconductor laser are particularly preferred.

Alkali aqueous solutions so far been known are preferably used as a developing solution and a replenisher in the development process of the heat-sensitive lithographic printing plate of the present invention.

For example, inorganic alkali salts such as sodium silicate, potassium silicate, tertiary sodium phosphate, tertiary potassium phosphate, tertiary ammonium phosphate, secondary sodium phosphate, secondary potassium phosphate, secondary ammonium phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, and lithium hydroxide can be exemplified. Further, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine are also used.

Further, an alkali aqueous solution comprising a non-reducing sugar and a base can also be used. Non-reducing sugars are sugars which do not have a free aldehyde group and a ketone group, thus do not have reducing property. They are classified into a trehalose type oligosaccharide in which reducing groups are bonded to each other, a glycoside in which reducing groups of sugars and non-sugars are bonded to each other, and a sugar alcohol obtained by the reduction by hydrogenation of sugars, and all of these non-reducing sugars can be preferably used in the present invention.

Trehalose type oligosaccharides include, e.g., succharose and trehalose, glycosides include, e.g., alkyl glycoside, phenol glycoside, and mustard oil glycoside, and sugar alcohols include, e.g., D- and L-arabitol, ribitol, xylitol, D- and L-sorbitol, D- and L-mannitol, D- and L-iditol, D- and L-talitol, dulicitol, and allodulcitol. In addition, maltitol obtained by hydrogenation of disaccharide and the reductant (reduced starch syrup) obtained by hydrogenation of oligosaccharide are preferably used.

Of the above non-reducing sugars, sugar alcohols and succharose are particularly preferred, and above all, D-sorbitol, succharose and reduced starch syrup are preferred, for the reason that they show buffer action in an appropriate pH range.

These non-reducing sugars can be used alone or in combination of two or more, and the proportion of non-reducing sugars in a developing solution is preferably from 0.1 to 30 mass % (i.e., weight %), and more preferably from 1 to 20 mass %.

Alkali agents can be used alone or in combination of two or more.

It is known that when development is carried out by using an automatic processor, a vast volume of PS plates can be processed without replacing the developing solution in a developing tank for a long period of time by the addition of an aqueous solution (a replenisher) having higher alkalinity than that of the developing solution to the developing solution. This replenishing system is preferably applied to the present invention. A developing solution and a replenisher can contain various surfactants and organic solvents according to necessity for purposes of accelerating or controlling development, dispersing developer scum, and increasing the ink-receptive property of the image area of the printing plate to ink. As preferred surfactants, anionic, cationic, nonionic, and ampholytic surfactants can be exemplified. Further, a developing solution and a replenisher can contain reducing agents such as hydroquinone, resorcin, sodium salts and potassium salts of inorganic acid such as sulfurous acid, sulfurous acid hydroacid, and further, organic carboxylic acid, defoaming agents, and water softeners, if necessary. The printing plate development-processed with the above-described developing solution and the replenisher is post-treated with a washing water, a rinsing water containing surfactants, and a desensitizing solution containing gum arabic and starch derivatives. When the image-recording material of the present invention is used as a printing plate, these treatments can be used in various combinations as post-treatment.

In recent years, an automatic processor (i.e., an automatic developing machine) for a printing plate is used prevailingly in the plate-making and printing industry for the purpose of rationalization and standardization of plate-making work. Such automatic processors generally consist of a development part and a post-treatment part and equipped with a conveying unit of a printing plate, processing solution tanks, and spraying unit. Development is performed by spraying each processing solution pumped up to the exposed printing plate by means of a spray nozzle while conveying the printing plate horizontally. A processing method by immersion-conveying a printing plate through a processing solution tank filled with a processing solution by means of guide rolls in liquid is also known. In such automatic processing, processing can be carried out with replenishing each replenisher to each processing solution corresponding to the processing amount, the operating time, etc. Moreover, a nonreturnable system in which processing is carried out with substantially a virgin solution is also applicable.

The processing method of the heat-sensitive lithographic printing plate in the present invention is described below. When an unnecessary image area (e.g., the film edge trace of the original film) is present on the lithographic printing plate obtained by image exposure, development, washing and/or rinsing and/or gumming, the unnecessary image area is erased. For this erasure, a method of coating an erasing solution on the unnecessary image area, allowing to stand for a predetermined time, and then washing with water as disclosed in Japanese Patent Publication No. 13293/1990 is preferably used, but a method of irradiating the unnecessary image area with actinic rays introduced by optical fibers and then performing development as disclosed in Japanese Patent Laid-Open No. 174842/1993 can also be utilized.

The thus-obtained lithographic printing plate can be offered to printing process after being coated with a desensitizing gum, as required, but when a lithographic printing plate having higher press life is desired, the plate is subjected to burning treatment. When a lithographic printing plate is subjected to burning treatment, it is preferred to treat the plate prior to burning with surface adjusting solutions as disclosed in Japanese Patent Publication Nos. 2518/1986, 28062/1980, Japanese Patent Laid-Open Nos. 31859/1987 and 159655/1986.

For that treatment, a method of coating a burning conditioner on the lithographic printing plate using sponge or absorbent cotton impregnated with a burning conditioner, or a method of coating by immersing the lithographic printing plate in a vat filled with a burning conditioner, or a method of coating by an automatic coater can be applied. Making the coating amount uniform by means of squeegee or squeegee rollers after coating results in preferred effect.

The coating amount of a burning conditioner is, in general, preferably from 0.03 to 0.8 g/$m^2$ (by dry weight). The lithographic printing plate coated with a burning conditioner is heated at high temperature after drying with a burning processor (e.g., "Burning Processor BP-1300", commercially available from Fuji Photo Film Co., Ltd.) and the like, if necessary. The heating temperature and the time depend upon the kinds of components comprising the image, but the temperature and the time are preferably from 180 to 300° C. and from 1 to 20 minutes.

The burning-treated lithographic printing plate can be arbitrarily subjected to conventional treatments such as washing and gumming according to necessity, but when a burning conditioner containing a water-soluble high molecular weight compound is used, so-called desensitizing treatment such as gumming can be omitted. A lithographic printing plate obtained through these processes is mounted on an offset printing press and used for printing a lot of sheets.

EXAMPLE

The present invention is described in detail below with reference to the examples, but the present invention should not be construed as being limited thereto.

1. Formation of Lithographic Printing Plate:

Examples 1 to 3 and Comparative Examples 1 to 3

A molten metal was prepared by using an aluminum alloy containing 0.06 mass % of Si, 0.30 mass % of Fe, 0.014 mass % of Cu, 0.001 mass % of Mn, 0.001 mass % of Mg, 0.001 mass % of Zn, 0.03 mass % of Ti, and the remainder comprising Al and inevitable impurities, and an ingot having a thickness of 500 mm and a width of 1,200 mm was formed by a DC casting method through forging treatments and filtration. The surface of the ingot was scraped off in a thickness of 10 mm with a scalping machine, soaking was 550° C. for about 5 hours. When the temperature lowered to 400° C., the scraped aluminum was made into an aluminum rolled plate having a thickness of 2.7 mm with a hot roller. The aluminum rolled plate was further subjected to heat treatment at 500° C. with a continuous annealing machine, and then to cold rolling, to thereby an aluminum plate having a thickness of 0.24 mm was finished. After the width of the aluminum plate was made 1,030 mm, the aluminum plate was subjected to the following surface treatments successively.

(a) Mechanical Surface Roughening Treatment:

Mechanical surface roughening treatment of the aluminum plate was performed with supplying an abrasive slurry of a suspension comprising water and an abrasive (siliceous sand) having a specific gravity of 1.12 on the surface of the aluminum plate by a rotating roller-like nylon brush. The average particle size of the abrasive was 8 $\mu$m, and the maximum particle size was 50 $\mu$m. The material of the nylon brush was 6, 10 nylon, the hair length was 50 mm, and the hair diameter was 0.3 mm. A stainless steel barrel having a diameter of 300 mm was perforated and nylon hair was planted densely to prepare a nylon brush. Three rotary brushes were used. The distance between two supporting rollers (diameter: 200 mm) at the lower part of each brush was 300 mm. The brush rollers were pressed against the aluminum plate until the load of the driving motor rotating the brushes came to the value of the load before pressing the brush rollers against the aluminum plate plus 7 kW. The direction of rotation of brushes was the same with the moving direction of the aluminum plate. The rotation number of the brushes was 200 rpm.

(b) Etching Treatment with Alkali Agent:

The above-obtained aluminum plate subjected to mechanical surface roughening treatment was subjected to spray etching treatment with an aqueous solution containing a sodium hydroxide in concentration of 2.6 mass % and an aluminum ion in concentration of 6.5 mass % at 70° C., thereby 6 g/$m^2$ of the aluminum plate was dissolved. The plate was then washed with water by spraying.

(c) Desmutting Treatment:

The aluminum plate was subjected to spray desmutting treatment with an aqueous solution containing a nitric acid in concentration of 1 mass % (containing 0.5 mass % of an aluminum ion) at 30° C., and then the plate was washed with water by spraying. The aqueous solution of nitric acid used in the desmutting treatment was the waste solution in the process of electrochemical surface roughening treatment by alternating current in an aqueous solution of nitric acid.

(d) Electrochemical Surface Roughening Treatment:

Electrochemical surface roughening treatment was performed continuously by alternating voltage of 60 Hz. The electrolyte at this time was an aqueous solution containing 10 g/liter of a nitric acid (containing 5 g/liter of an aluminum ion and 0.007 mass % of an ammonium ion) and the temperature was 80° C.

The electric current density was 30 A/$dm^2$ at a peak value of electric current, and the quantity of electricity was 130 C/$dm^2$ in the quantity of electricity of sum total in the case where the aluminum plate was the anode. Five percent of the electric current from the electric source was diverted to the supporting anode.

The aluminum plate was then washed with water by spraying.

(e) Alkali Etching Treatment:

The aluminum plate was subjected to etching treatment by spraying with an aqueous solution comprising a sodium hydroxide in concentration of 26 mass % and an aluminum ion in concentration of 6.5 mass % at 32° C., thereby 0.20 g/$m^2$ of the aluminum plate was dissolved. A smut component mainly comprising an aluminum hydroxide which was formed when electrochemical surface roughening treatment was performed by alternating voltage in the prior stage was removed, and also the edge parts of the pits formed were dissolved to smooth the edge part, and then the aluminum plate was washed with water by spraying.

(f) Desmutting Treatment:

Desmutting treatment by spraying was performed with an aqueous solution containing a sulfuric acid in concentration of 25 mass % (containing 0.5 mass % of an aluminum ion) at 60° C., and then the aluminum plate was washed with water by spraying.

(g) Anodic Oxidation Treatment:

Anodic oxidation treatment was performed by using an anodic oxidation apparatus of two-stage feeding electrolytic treatment system (the length of the first and second electrolytic zones: 6 m each, the length of the first and second (electro-)feeding zones: 3 m each, the length of the first and second (electro-) feeding electrodes: 2.4 m each). As the electrolyte fed to the first and second electrolytic zones, a sulfuric acid was used. Every electrolyte contained a sulfuric acid in concentration of 170 g/liter (containing 0.5 mass % of an aluminum ion) and the temperature of the electrolyte was 43° C. The aluminum plate was then washed with water by spraying. The final amount of the oxide film was 2.7 g/$m^2$.

(h) Treatment with Alkali Metal Silicate:

Treatment with alkali metal silicate (silicate treatment) was performed by immersing the aluminum support obtained by anodic oxidation treatment in a treating tank containing 1 mass % aqueous solution of disodium trisilicate at 30° C. for 10 seconds. The aluminum plate was then washed with water by spraying.

(i) Formation of Undercoating Layer:

A coating solution for forming an undercoating layer having the composition shown below was coated on the aluminum support subjected to treatment with alkali metal silicate, and then the support was dried at 80° C. for 15 seconds.

Composition of Undercoating Layer Coating Solution:

| | |
|---|---|
| High molecular weight compound shown in Table 1 below. | 0.3 g |
| Methanol | 100 g |
| Water | 1 g |

TABLE 1

| Example No. | High Molecular Weight Compound | Molecular Weight (Mn) |
|---|---|---|
| Example 1 | Exemplified Compound No. 1 | 2,100 |
| Example 2 | Exemplified Compound No. 2 | 4,800 |
| Example 3 | Exemplified Compound No. 3 | 3,200 |
| Comparative Example 1 | Comparative Compound A (shown below) | 200,000 |
| Comparative Example 2 | Comparative Compound B (shown below) | 630,000 |
| Comparative Example 3 | No compound was added | — |

Comparative Compound

| Structure | Number Average Molecular Weight (Mn) |
|---|---|
| A 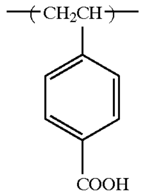 | 200,000 |
| B 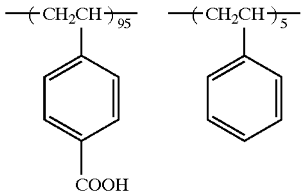 | 630,000 |

(j) Formation of Interlayer and Heat-sensitive Layer:

A coating solution for forming an interlayer having the composition shown below was coated on the support of the lithographic printing plate provided with the undercoating layer in a dry coating amount of 0.85 g/m$^2$, and the coated layer was dried at 140° C. for 50 seconds in PERFECT OVEN PH200 (manufactured by TABAI Co.) by setting Wind Control at 7.

Subsequently, a coating solution for forming a heat-sensitive layer having the composition shown below was coated on the interlayer in a dry coating amount of 0.15 g/m$^2$, and the coated layer was dried at 120° C. for 1 minute, thereby a heat-sensitive lithographic printing plate was obtained.

| Composition of interlayer coating solution: | |
|---|---|
| N-(p-Aminosulfonylphenyl)methacrylamide/acrylonitrile/methyl methacrylate copolymer (monomer ratio: 36/34/30, weight average molecular weight: 50,000) | 1.896 g |
| m-, p-Cresol novolak (m/p ratio = 6/4, weight average molecular weight: 4,500, containing 0.8 mass % of unreacted cresol) | 0.237 g |
| Cyanine dye A (represented by the formula shown below) | 0.109 g |
| 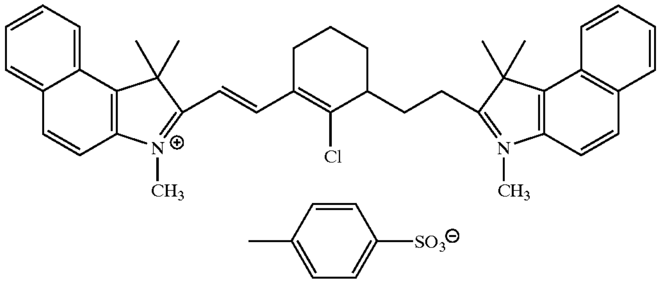 | |
| 4,4'-bis-Hydroxyphenylsulfone | 0.063 g |
| Tetrahydrophthalic anhydride | 0.190 g |

-continued

| | |
|---|---|
| p-Toluenesulfonic acid | 0.008 g |
| 2-Methoxy-4-(N-phenylamino)benzene diazonium hexafluorophosphate | 0.03 g |
| Ethyl Violet having 6-hydroxy-β-naphthalenesulfonic acid as the counter ion | 0.05 g |
| Fluorine surfactant, Megafac F-176 (manufactured by Dainippon Ink & Chemicals Inc.) | 0.035 g |
| Methyl ethyl ketone | 26.6 g |
| 1-Methoxy-2-propanol | 13.6 g |
| γ-Butyrolactone | 13.8 g |
| Composition of heat-sensitive layer coating solution: | |
| m-, p-Cresol novolak (m/p ratio = 6/4, weight average molecular weight: 4,500, containing 0.8 mass % of unreacted cresol) | 0.237 g |
| Cyanine dye A (represented by the formula shown above) | 0.047 g |
| Dodecyl stearate | 0.060 g |
| 3-Methoxy-4-diazodiphenylamine hexafluorophosphate | 0.030 g |
| Fluorine surfactant, Megafac F-176 (manufactured by Dainippon Ink & Chemicals Inc.) | 0.110 g |
| Fluorine surfactant, Defenser MCF-312 (solid content: 30 mass %, manufactured by Dainippon Ink & Chemicals, Inc.) | 0.120 g |
| Methyl ethyl ketone | 15.1 g |
| 1-Methoxy-2-propanol | 7.7 g |

Comparative Example 4

An undercoating layer was coated in the same manner as in Example 1 on the same support as obtained in Example 1, and a heat-sensitive layer coating solution having the composition shown below was coated on the undercoating layer.

| Composition of coating solution for monolayer heat-sensitive layer: | |
|---|---|
| m-, p-Cresol novolak (m/p ratio = 6/4, weight average molecular weight: 4,500, containing 0.8 mass % of unreacted cresol) | 0.474 g |
| N-(p-Aminosulfonylphenyl)methacrylamide/acrylonitrile/methyl methacrylate copolymer (monomer ratio: 36/34/30, weight average molecular weight: 50,000) | 2.37 g |
| Cyanine dye A (represented by the formula shown above) | 0.155 g |
| 2-Methoxy-4-(N-phenylamino)benzene diazonium hexafluorophosphate | 0.03 g |
| Tetrahydrophthalic anhydride | 0.19 g |
| Ethyl Violet having 6-hydroxy-β-naphthalenesulfonic acid as the counter ion | 0.05 g |
| Fluorine surfactant, Megafac F-176 (manufactured by Dainippon Ink & Chemicals Inc.) | 0.07 g |
| Fluorine surfactant, Defenser MCF-312 (solid content: 30 mass %, manufactured by Dainippon Ink & Chemicals, Inc.) | 0.12 g |
| p-Toluenesulfonic acid | 0.008 g |
| 4,4'-bis-Hydroxyphenylsulfone | 0.063 g |
| n-Dodecyl stearate | 0.06 g |
| γ-Butyrolactone | 13 g |
| Methyl ethyl ketone | 24 g |
| 1-Methoxy-2-propanol | 11 g |

2. Evaluation of Development Latitude:

A test pattern was imagewise drawn on the above-obtained heat-sensitive lithographic printing plate with Trendsetter (manufactured by Creo Co.) by beam intensity of 9 W and drum revolving speed of 150 rpm.

Thereafter, the printing plate was subjected to development with PS Processor 940H (manufactured by Fuji Photo Film Co., Ltd.) charged with a developing solution DT-1 (diluted) and Finisher FP2W (diluted to 1 time) (manufactured by Fuji Photo Film Co., Ltd.) at liquid temperature of 30° C. and developing time for 12 seconds. The electrical conductance of the developing solution as this time was set every 2 mS/cm between 35 mS/cm and 65 mS/cm by controlling the dilution rate.

The development processed lithographic printing plate was evaluated regarding 1) dilution rate of the developing solution at which staining and coloring attributing to development failure in the non-image area became tolerable (exposed area) (the value of electrical conductance), and 2) the optical density in the unexposed area (image area) of the heat-sensitive layer by visual observation, and the dilution rate of the developing solution of the limit where lowering of the optical density was tolerable (the value of electrical conductance) was obtained.

The greater the difference between two values, the more excellent is the development latitude. The results obtained are shown in Table 2 below.

TABLE 2

| Example No. | Value of Electrical Conductance at Which Staining and Coloring in Non-Image Area Become Tolerable (ms/cm) | Value of Electrical Conductance at Which Lowering of Optical Density in Image Area is Tolerable (ms/cm) | Difference between the Values of Electrical Conductance in the Left Two Columns (ms/cm) |
|---|---|---|---|
| Example 1 | 39 | 59 | 20 |
| Example 2 | 39 | 59 | 20 |
| Example 3 | 39 | 57 | 18 |
| Comparative Example 1 | 37 | 47 | 10 |

TABLE 2-continued

| Example No. | Value of Electrical Conductance at Which Staining and Coloring in Non-Image Area Become Tolerable (ms/cm) | Value of Electrical Conductance at Which Lowering of Optical Density in Image Area is Tolerable (ms/cm) | Difference between the Values of Electrical Conductance in the Left Two Columns (ms/cm) |
|---|---|---|---|
| Comparative Example 2 | 42 | 52 | 8 |
| Comparative Example 3 | Did not become tolerable. | 49 | — |
| Comparative Example 4 | 41 | 49 | 8 |

As is apparent from the results shown in Table 2, the non-image area of the lithographic printing plates in the present invention showed excellent developability even when the printing plate was developed with a developing solution having low activity and, further, the image area did not elute by development with a developing solution having high activity.

On the other hand, the samples in Comparative Examples 1 and 2 in which the undercoating layer coating solution did not have an onium group were low in latitude to the developing solution having high activity, and in the sample in Comparative Example 3 not having an undercoating layer, the developability of the non-image area did not become tolerable at all. Further, the sample in which the heat-sensitive layer was a monolayer showed narrow latitude to the developing solution having high activity.

Thus, from the results in Table 2, it was confirmed that the heat-sensitive lithographic printing plate in the present invention was excellent in development latitude.

Effect of the Invention

The present invention can provide a positive heat-sensitive lithographic printing plate excellent in latitude in development for image-forming.

The entitle disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A positive heat-sensitive lithographic printing plate comprising an anodically oxidized aluminum support having laminated thereon an undercoating layer containing a polymer having a constituent having an acid radical and a constituent having an onium group, an interlayer containing a water-insoluble and alkali-soluble resin, and a heat-sensitive layer containing a water-insoluble and alkali-soluble resin and an infrared-absorbing dye in this order from the support, and the solubility of the heat-sensitive layer in an alkali aqueous solution increases by heating, wherein the interlayer contains an onium salt.

2. The positive heat-sensitive lithographic printing plate as claimed in claim 1, wherein the number average molecular weight of the polymer Mn is from 300 to 100,000, and the coating weight of the undercoating layer is from 1 to 30 $mg/m^2$.

3. The positive heat-sensitive lithographic printing plate as claimed in claim 1, wherein the infrared-absorbing dye is at least one of cyanine dyes.

4. The positive heat-sensitive lithographic printing plate as claimed in claim 1, wherein the onium salt is a diazonium salt.

* * * * *